US012713617B2

(12) United States Patent
Choe et al.

(10) Patent No.: US 12,713,617 B2
(45) Date of Patent: Aug. 18, 2026

(54) MEMORY DEVICE IMPLEMENTING MULTI-BIT AND MEMORY APPARATUS INCLUDING THE SAME

(71) Applicant: Samsung Electronics Co., Ltd., Suwon-si (KR)

(72) Inventors: Dukhyun Choe, Suwon-si (KR); Jinseong Heo, Suwon-si (KR); Hyunjae Lee, Suwon-si (KR); Seunggeol Nam, Suwon-si (KR); Yoonsang Park, Suwon-si (KR); Sijung Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 369 days.

(21) Appl. No.: 18/414,933

(22) Filed: Jan. 17, 2024

(65) Prior Publication Data

US 2024/0260274 A1 Aug. 1, 2024

(30) Foreign Application Priority Data

Jan. 26, 2023 (KR) ........................ 10-2023-0010235
Nov. 29, 2023 (KR) ........................ 10-2023-0169845

(51) Int. Cl.
*H10B 51/20* (2023.01)
*H10B 53/20* (2023.01)
(Continued)

(52) U.S. Cl.
CPC ............. *H10B 51/20* (2023.02); *H10B 53/20* (2023.02); *H10D 30/701* (2025.01); *H10D 64/033* (2025.01); *H10D 64/689* (2025.01)

(58) Field of Classification Search
CPC ................................ H10B 51/20; H10B 53/20
See application file for complete search history.

(56) References Cited

U.S. PATENT DOCUMENTS 6,236,076 B1 5/2001 Arita et al.
7,709,359 B2 5/2010 Boescke et al.
(Continued)

FOREIGN PATENT DOCUMENTS

CN 114709213 A 7/2022
KR 10-2021-0130090 A 10/2021
KR 10-2021-0140858 A 11/2021

OTHER PUBLICATIONS

Yoonho Ahn et al., "Imprint phenomenon of ferroelectric switching characteristics in BaTiO3/ PbTiO3 multilayer thin films", Journal of Alloys and Compounds 891, 162088, pp. 1-5 (2021).
(Continued)

*Primary Examiner* — Benjamin P Sandvik
(74) *Attorney, Agent, or Firm* — Harness, Dickey & Pierce, P.L.C.

(57) ABSTRACT

Provided are a memory device implementing multi-bit functionality and a memory apparatus including the memory device. The memory device includes a semiconductor substrate, a gate electrode on the semiconductor substrate, and a plurality of ferroelectric layers laminated between the semiconductor substrate and the gate electrode in a first direction perpendicular to a surface of the semiconductor substrate and including at least one first ferroelectric layer and at least one second ferroelectric layer. The first ferroelectric layer has a doping concentration gradient in which a doping concentration increases in the first direction, and the second ferroelectric layer has a doping concentration gradient in which a doping concentration decreases in the first direction. The memory device is configured to implement multi-bit functionality according to an operating voltage.

20 Claims, 33 Drawing Sheets

(51) Int. Cl.
*H10D 30/69* (2025.01)
*H10D 64/01* (2025.01)
*H10D 64/68* (2025.01)

(56) References Cited

U.S. PATENT DOCUMENTS 8,304,823 B2 11/2012 Boescke
9,349,842 B2 5/2016 Schloesser et al.
9,786,684 B2 10/2017 Ramaswamy et al.
9,830,969 B2 * 11/2017 Slesazeck .............. H10B 51/30
9,831,239 B1 11/2017 Shin et al.
9,966,465 B1 5/2018 Chin et al.
9,978,868 B2 5/2018 Lai et al.
10,050,143 B2 8/2018 Ando et al.
10,056,393 B2 8/2018 Schröder et al.
10,374,086 B2 8/2019 Hu
10,861,862 B1 * 12/2020 Lu .......................... H10B 53/10
10,861,968 B1 12/2020 Young et al.
2014/0070289 A1 * 3/2014 Tanaka ................. H10D 64/033
257/295
2016/0308070 A1 10/2016 Chang et al.
2020/0055134 A1 2/2020 Heo et al.
2020/0058658 A1 2/2020 Heo et al.
2020/0105770 A1 4/2020 Yoo
2020/0286985 A1 9/2020 Lim et al.
2021/0043654 A1 2/2021 Yoo et al.
2021/0098060 A1 * 4/2021 Ni .......................... H10B 53/30
2021/0098595 A1 4/2021 Lee et al.
2021/0118990 A1 4/2021 Jo et al.
2021/0202508 A1 7/2021 Jeon
2021/0328063 A1 10/2021 Lee et al.
2021/0358924 A1 11/2021 Song
2021/0359101 A1 11/2021 Heo et al.
2021/0375890 A1 * 12/2021 Chia ...................... H10B 53/30
2022/0140148 A1 5/2022 Nam et al.
2022/0173255 A1 6/2022 Heo et al.
2022/0223712 A1 7/2022 Peng et al.
2022/0278115 A1 9/2022 Wei et al.
2022/0285521 A1 9/2022 Hsu et al.

OTHER PUBLICATIONS

Kai Ni et al., "A Novel Ferroelectric Superlattice Based Multi-Level Cell Non-Volatile Memory", IEEE International Electron Devices Meeting (IEDM). https://doi.org/10.1109/IEDM19573.2019.8993670 (2019).
"Imprint in ferroelectrics—Practical Electron Microscopy and Database—An Online Book", https://www.globalsino.com/EM/page1792.html.
Extended European Search Report dated Jun. 18, 2024 issued in European Patent Application No. 24153639.0-1211.
Zhou Y et al.: "Mechanisms of Imprint Effect On Ferroelectric Thin Films", Journal of Applied Physics, American Institute of Physics, 2 Huntington Quadrangle, Melville, NY 11747, vol. 98, No. 2, Jul. 25, 2005, XP012078154.
Office Action from corresponding European Patent Application No. 24153639.0, dated Feb. 17, 2026.

* cited by examiner

MEMORY DEVICE IMPLEMENTING MULTI-BIT AND MEMORY APPARATUS INCLUDING THE SAME

CROSS-REFERENCE TO RELATED APPLICATIONS

This application is based on and claims priority under 35 U.S.C. § 119 to Korean Patent Application Nos. 10-2023-0010235, filed on Jan. 26, 2023 and 10-2023-0169845 filed on Nov. 29, 2023 in the Korean Intellectual Property Office, the disclosures of each of which are incorporated by reference herein in their entirety.

BACKGROUND

Various example embodiments relate to a memory device implementing multi-bit and/or a memory apparatus including the memory device.

Ferroelectrics refer to a material having ferroelectricity to maintain spontaneous polarization by aligning internal electric dipole moments, while no electric field is applied from the outside. Recently, researches for implementing multi-bit memory cells by applying ferroelectrics to memory devices have been conducted.

SUMMARY

Provided are a memory device implementing multi-bit and/or a memory apparatus including the memory device.

Additional aspects will be set forth in part in the description which follows and, in part, will be apparent from the description, and/or may be learned by practice of the various example embodiments.

According to some example embodiments, a memory device includes a semiconductor substrate, a gate electrode on the semiconductor substrate, and a plurality of ferroelectric layers including at least one first ferroelectric layer and at least one second ferroelectric layer, the plurality of ferroelectric layers laminated between the semiconductor substrate and the gate electrode in a first direction perpendicular to a surface of the semiconductor substrate. The first ferroelectric layer has a doping concentration gradient in which a doping concentration increases in the first direction, and the second ferroelectric layer has a doping concentration gradient in which a doping concentration decreases in the first direction. The memory device is configured to implement multi-bit functionality according to an operating voltage.

Alternatively or additionally according to various example embodiments, provided is an operating method of a memory device, the memory device including a semiconductor substrate, a gate electrode on the semiconductor substrate, and a plurality of ferroelectric layers including at least one first ferroelectric layer and at least one second ferroelectric layer, the plurality of ferroelectric layers laminated between the semiconductor substrate and the gate electrode in a first direction perpendicular to a surface of the semiconductor substrate. The first ferroelectric layer has a doping concentration gradient in which a doping concentration increases in the first direction, and the second ferroelectric layer has a doping concentration gradient in which a doping concentration decreases in the first direction. The operating method comprises obtaining multiple-levels in different polarization states from each other by adjusting an operating voltage based on a hysteresis curve associated with the plurality of ferroelectric layers.

Alternatively or additionally according to various example embodiments, a memory apparatus includes a plurality of gate electrodes laminated in a direction perpendicular to a surface of a substrate, a plurality of ferroelectric layers on the plurality of gate electrodes and including at least one first ferroelectric layer and at least one second ferroelectric layer, and a channel layer on the plurality of ferroelectric layers, wherein the first ferroelectric layer has a doping concentration gradient in which a doping concentration increases in the first direction, and the second ferroelectric layer has a doping concentration gradient in which a doping concentration decreases in the first direction, and wherein the memory apparatus is configured to implement multi-bit functionality according to an operating voltage.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
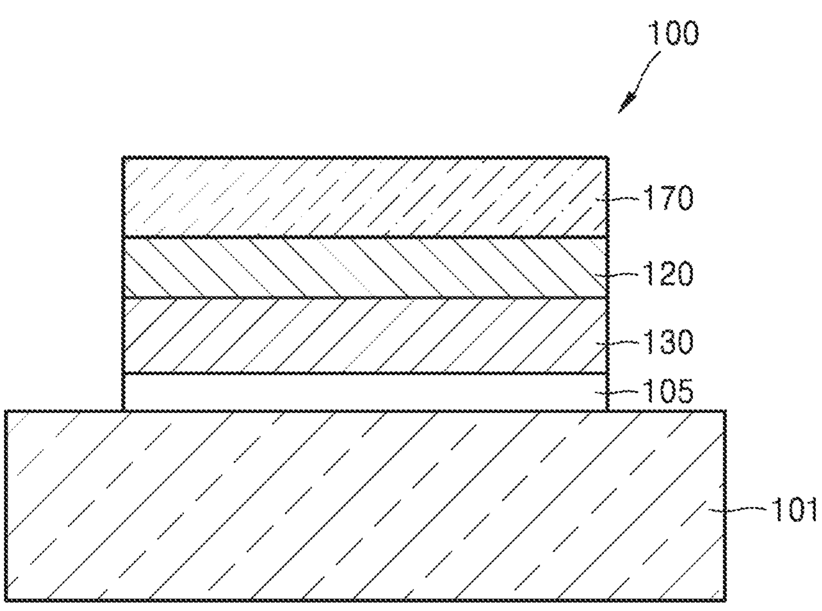
FIG. 1 is a cross-sectional view of a memory device according to some example embodiments.

Reference will now be made in detail to various embodiments, examples of which are illustrated in the accompanying drawings, wherein like reference numerals refer to like elements throughout. In this regard, the present embodiments may have different forms and should not be construed as being limited to the descriptions set forth herein. Accordingly, various embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in detail with reference to the accompanying drawings. In the drawings, like reference numerals in the drawings denote like elements, and sizes of components in the drawings may be exaggerated for clarity and convenience of explanation. Meanwhile, various embodiments described below are provided only as an example, and thus can be embodied in various forms.

It will be understood that when a component is referred to as being "on" or "over" another component, the component can be directly on, under, on the left of, or on the right of the other component, or can be on, under, on the left of, or on the right of the other component in a non-contact manner. An expression used in the singular encompasses the expression of the plural, unless it has a clearly different meaning in the context. When a portion "includes" an element, another element may be further included, rather than excluding the existence of the other element, unless otherwise described.

The use of the terms "a" and "an" and "the" and similar referents in the context of describing embodiments (especially in the context of the following claims) are to be construed to cover both the singular and the plural. The operations of all methods described herein can be performed in any suitable order unless otherwise indicated herein or otherwise clearly contradicted by context, and embodiments are not limited to the described order of the operations.

Moreover, the terms "part," "module," etc. refer to a unit processing at least one function or operation, and may be implemented by a hardware, a software, or a combination thereof.

The connecting lines, or connectors shown in the various figures presented are intended to represent exemplary functional relationships and/or physical or logical couplings between the various elements, and thus it should be noted that many alternative or additional functional relationships, physical connections or logical connections may be present in a practical device.

The use of any and all examples, or exemplary language provided herein, is intended merely to better illuminate technical ideas and does not pose a limitation on the scope of embodiments unless otherwise claimed.

FIG. 1 is a cross-sectional view of a memory device 100 according to some example embodiments. The memory device 100 illustrated in FIG. 1 may be a ferroelectric field effect transistor (FEFET).

Referring to FIG. 1, the memory device 100 may include a semiconductor substrate 101, a gate electrode 170, a first ferroelectric layer 120 and a second ferroelectric layer 130 laminated between the semiconductor substrate 101 and the gate electrode 170. A channel region may be formed on the semiconductor substrate 101 in correspondence with the gate electrode 170, and a source region and a drain region may be formed on either sides of the channel region, respectively.

The semiconductor substrate 101 may include at least one Group IV semiconductor material doped with a dopant having a certain polarity. The Group IV semiconductor material may include, for example, one or more of Si, Ge, or SiGe. However, example embodiments are not limited thereto.

A dopant doped with a Group IV semiconductor material may become a p-type dopant or an n-type dopant. A p-type dopant may include, for example, one or more of B, Al, Ga, In, etc., and an n-type dopant may include, for example, one or more of P, As, etc. More specifically, the semiconductor substrate 101 may be a p-Si substrate including Si doped with a p-type dopant or an n-Si substrate including Si doped with an n-type dopant. However, this is only an example. A concentration of a dopant doped to the semiconductor substrate 101 may be, for example, about $10^{15}$ $cm^{-3}$ to $10^{20}$ $cm^{-3}$(dopants per cubic centimeter) However, example embodiments are not limited thereto. In some example embodiments, the semiconductor substrate 101 may be doped with both n-type dopants and p-type dopants but at different concentrations from each other; for example, a dopant concentration of p-type dopants may be much greater than (e.g., several orders of magnitude greater than), or may be much less than (e.g., several orders of magnitude less than) a dopant concentration of n-type dopants.

An insulating layer 105 may be further provided on a surface of the semiconductor substrate 101. The insulating layer 105 may include an oxide and/or an oxynitride of a Group IV semiconductor material. For example, the insulating layer 105 may include one or more of $SiO_2$, $GeO_2$, $SiGeO_4$, SiON, GeON, SiGeON, etc. However, the foregoing is provided only as an example.

The gate electrode 170 may be provided on the semiconductor substrate 101. The gate electrode 170 may include a metal and/or a metallic nitride. The metal may include, for example, one or more of aluminum (Al), tungsten (W), molybdenum (Mo), titanium (Ti), or tantalum (Ta), and the metallic nitride may include, for example, titanium nitride (TiN) and/or tantalum nitride (TaN).

The gate electrode 170 may include one or more of a metal carbide, polysilicon such as undoped or doped polysilicon, or a two-dimensional (2D) conductive material. The metal carbide may be or may include a metal carbide doped with aluminum or silicon. More specifically, the metal carbide may include one or more of TiAlC, TaAlC, TiSiC, or TaSiC. The gate electrode 170 may have a structure in which a plurality of materials are laminated. For example, the gate electrode 170 may have a lamination structure of metal nitride layer/metal layer or a lamination structure of metal nitride layer/metal carbide layer/metal layer, such as TiN/TiAlC/W.

The first and second ferroelectric layers 120 and 130 may be laminated between, e.g. may be directly between, the semiconductor substrate 101 and the gate electrode 170 in a direction perpendicular to the semiconductor substrate 101. The first and second ferroelectric layers 120 and 130 may each include a ferroelectric material including a certain dopant. The first and second ferroelectric layers 120 and 130 may include the same material; however, example embodiments are not limited thereto, and the first and second ferroelectric layers 120 and 130 may include different materials from each other.

Ferroelectric materials refer to a material having ferroelectricity to maintain spontaneous polarization by aligning internal electric dipole moments. Ferroelectric materials have remnant polarization by a dipole even when no electric field from outside is applied thereto. In ferroelectric materials, a polarization direction may be switched in units of domains by an external electric field dopant unit.

The first and second ferroelectric layers 120 and 130 may each independently or concurrently include, for example, one or more of a nitride-based material, perovskite, or a fluorite-based material. The nitride-based material may include, for example AlScN, and perovskite may include, for example, PZT, $BaTiO_3$, $PbTiO_3$, etc. However, example embodiments are not limited thereto. The fluorite-based material may include, for example, an oxide of at least one selected from Hf, Si, Al, Zr, Y, La, Gd, and Sr. More specifically, the fluorite-based material may include at least one of a hafnium oxide (HfO), a zirconium oxide (ZrO), and a hafnium-zirconium oxide (HfZrO).

The first and second ferroelectric layers 120 and 130 may each include a certain dopant. For example, the first and second ferroelectric layers 120 and 130 may each include a hafnium oxide injected with or incorporating a certain dopant. The dopant may include, for example, at least one of Zr, La, Al, Si, and Y. However, example embodiments are not limited thereto. For example, the first and second ferroelectric layers 120 and 130 may each include an aluminum nitride injected with a certain dopant. The dopant may include, for example, at least one of B and Sc; however, example embodiments are not limited thereto. The first ferroelectric layer 120 and the second ferroelectric layer 130 may include the same and/or different dopants from each other.

The first and second ferroelectric layers 120 and 130 may each include an imprinted ferroelectric material. The "imprint of ferroelectric material" refers to a phenomenon in which hysteresis characteristics of a ferroelectric material move along a voltage axis in a polarization (P)-voltage (V) characteristics curve of the ferroelectric material. The imprint of ferroelectric material includes a negative (−) imprint which involves hysteresis characteristics of a ferroelectric material moving in the negative (−) voltage direction and a positive (+) imprint which involves hysteresis characteristics of a ferroelectric material moving in the positive (+) voltage direction. Such an imprint of ferroelectric material may be caused by asymmetry of ferroelectricity of the ferroelectric material. The asymmetry of ferroelectricity may occur when a doping concentration gradient is generated due to change of dopant concentration according to a position in a ferroelectric material, and/or from formation of different material layers at upper and lower interfaces of the ferroelectric material. The greater the asymmetry of ferroelectricity in a ferroelectric material is, the greater the imprint of the ferroelectric material may be.

The first and second ferroelectric layers 120 and 130 may include ferroelectric materials imprinted in opposite directions to each other. More specifically, the first ferroelectric layer 120 may include a ferroelectric layer imprinted in a negative (−) voltage direction, and the second ferroelectric layer 130 may include a ferroelectric layer imprinted in a positive (+) voltage direction. As described below, as the lamination structure of the first and second ferroelectric layers 120 and 130 imprinted in opposite directions to each other is provided between the semiconductor substrate 101 and the gate electrode 170, multi-bit having a multi-level of three or more levels may be implemented.

Figure 2A:
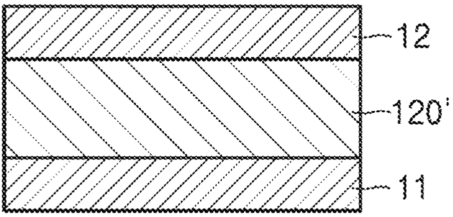
FIG. 2A is a diagram of a capacitor including a ferroelectric layer imprinted in a (−) voltage direction.
Figure 2B:
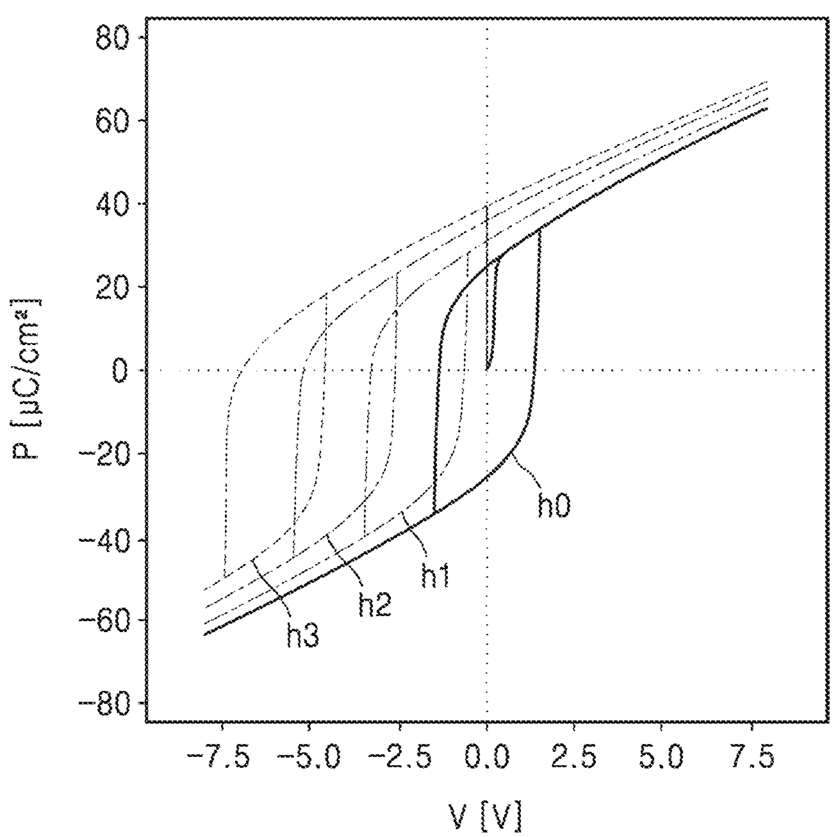
FIG. 2B is a diagram illustrating polarization (P)-voltage (V) characteristics of the ferroelectric layer of the capacitor illustrated in FIG. 2A.

FIG. 2A illustrates a capacitor including a ferroelectric layer 120' imprinted in the (−) voltage direction, and FIG. 2B illustrates polarization (P)-voltage (V) characteristics of the ferroelectric layer 120' of the capacitor illustrated in FIG. 2A.

Referring to FIG. 2A, the ferroelectric layer 120' imprinted in the (−) voltage direction may be provided between two metal electrodes 11 and 12. The ferroelectric layer 120' imprinted in the (−) voltage direction may have a doping concentration gradient in which concentration of a dopant varies (e.g., various linearly or continuously, such as monotonically) in a thickness direction of the ferroelectric layer 120'. For example, the ferroelectric layer 120' imprinted in the (−) voltage direction may have a doping concentration gradient in which concentration of a dopant increases from a lower portion of the ferroelectric layer 120' to an upper portion. The concentration gradient may be concave and/or convex, and in some example embodiments may be monotonic; example embodiments are not limited thereto; in some cases, the concentration gradient may be discontinuous. The ferroelectric layer 120' imprinted in the (−) voltage direction may include a ferroelectric material layer and interface layers including different materials at upper and lower interfaces of the ferroelectric material layer.

Referring to FIG. 2B, "h0" represents a hysteresis curve of an unimprinted ferroelectric layer, "h1," "h2," and "h3" respectively represent hysteresis curves of the ferroelectric layer 120' imprinted in the (−) voltage direction. The greater the imprint degree of the ferroelectric layer 120' in the (−)

voltage direction is, the more the hysteresis curve of the ferroelectric layer 120' may move towards "h3".

Figure 3A:
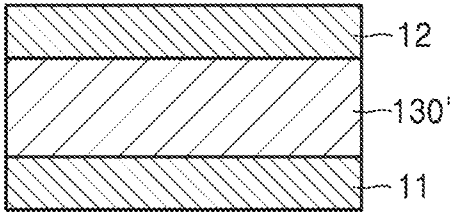
FIG. 3A is a diagram of a capacitor including a ferroelectric layer imprinted in a (+) voltage direction.
Figure 3B:
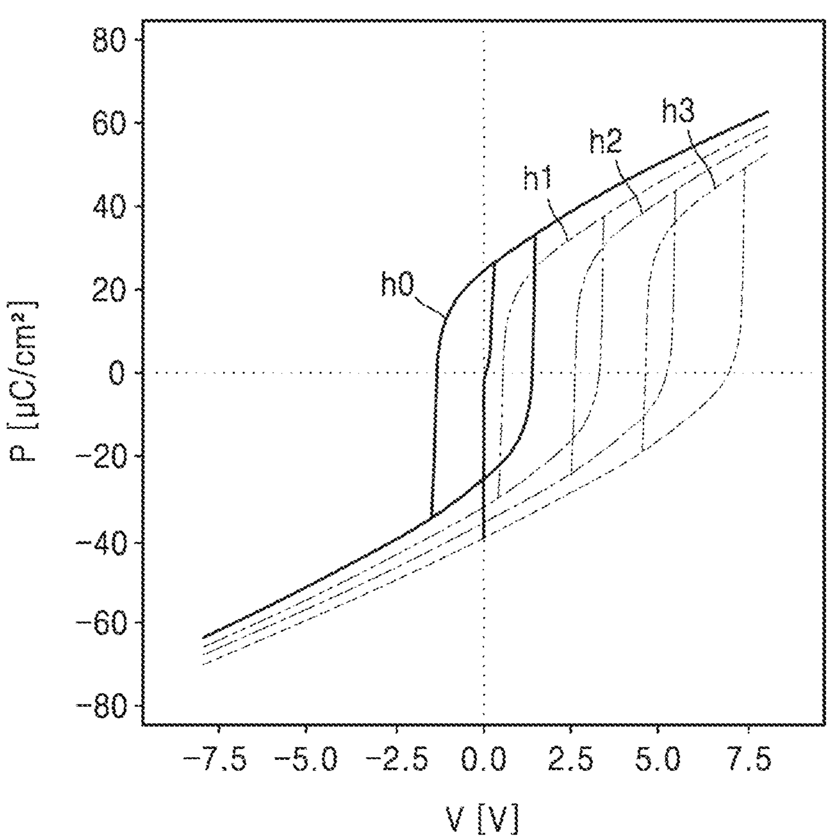
FIG. 3B is a diagram illustrating polarization (P)-voltage (V) characteristics of the ferroelectric layer of the capacitor illustrated in FIG. 3A.

FIG. 3A illustrates a capacitor including a ferroelectric layer 130' imprinted in the (+) voltage direction, and FIG. 3B illustrates polarization (P)-voltage (V) characteristics of the ferroelectric layer 130' of the capacitor illustrated in FIG. 3A.

Referring to FIG. 3A, the ferroelectric layer 130' imprinted in the (+) voltage direction may be provided between two metal electrodes 11 and 12. The ferroelectric layer 130' imprinted in the (+) voltage direction may have a doping concentration gradient in which concentration of a dopant varies in a thickness direction of the ferroelectric layer 130'. The ferroelectric layer 130' imprinted in the (+) voltage direction may have a doping concentration gradient that is opposite to that of the ferroelectric layer 120' imprinted in the (−) voltage direction. For example, the ferroelectric layer 130' imprinted in the (+) voltage direction may have a doping concentration gradient in which concentration of a dopant decreases, e.g. decreases monotonically and/or continuously, from a lower portion of the ferroelectric layer 130' to an upper portion. The ferroelectric layer 130' imprinted in the (+) voltage direction may include a ferroelectric material layer and interface layers including different materials at upper and lower interfaces of the ferroelectric material layer.

Referring to FIG. 3B, "h0" represents a hysteresis curve of an unimprinted ferroelectric layer, "h1," "h2," and "h3" respectively represent hysteresis curves of the ferroelectric layer 130' imprinted in the (+) voltage direction. The greater the imprint degree of the ferroelectric layer 130' in the (+) voltage direction is, the more the hysteresis curve of the ferroelectric layer 130' may move towards "h3".

Figure 4A:
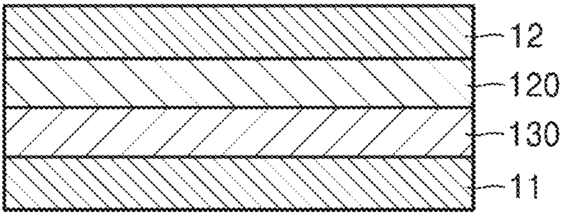
FIG. 4A is a diagram of a capacitor including a lamination structure of a first ferroelectric layer imprinted in a (−) voltage direction and a second ferroelectric layer imprinted in a (+) voltage direction.

FIG. 4A is a diagram of a capacitor including a lamination structure of the first ferroelectric layer 120 imprinted in the (−) voltage direction and the second ferroelectric layer 130 imprinted in the (+) voltage direction. The first and second ferroelectric layers 120 and 130 illustrated in FIG. 4A may be the same as the first and second ferroelectric layers 120 and 130 illustrated in FIG. 1.

Referring to FIG. 4A, the first ferroelectric layer 120 and the second ferroelectric layer 130 may be laminated between the two metal electrodes 11 and 12 in a direction perpendicular to the metal electrodes 11 and 12. The first and second ferroelectric layers 120 and 130 may be imprinted in opposite directions to each other. More specifically, the first ferroelectric layer 120 may be imprinted in the (−) voltage direction, and the second ferroelectric layer 130 may be imprinted in the (+) voltage direction. A thickness of the first ferroelectric layer 120 may be the same as, greater than, or less than that of the second ferroelectric layer 130.

The first and second ferroelectric layers 120 and 130 may each have a doping concentration gradient in which concentration of a dopant varies in a thickness direction. More specifically, the first ferroelectric layer 120 imprinted in the (−) voltage direction may have a concentration gradient in which doping concentration of a dopant increases from a lower portion of the first ferroelectric layer 120 towards an upper portion of the first ferroelectric layer 120, and the second ferroelectric layer 130 imprinted in the (+) voltage direction may have a concentration gradient in which doping concentration of a dopant decreases from a lower portion of the second ferroelectric layer 130 towards an upper portion of the second ferroelectric layer 130.

Figure 5A:
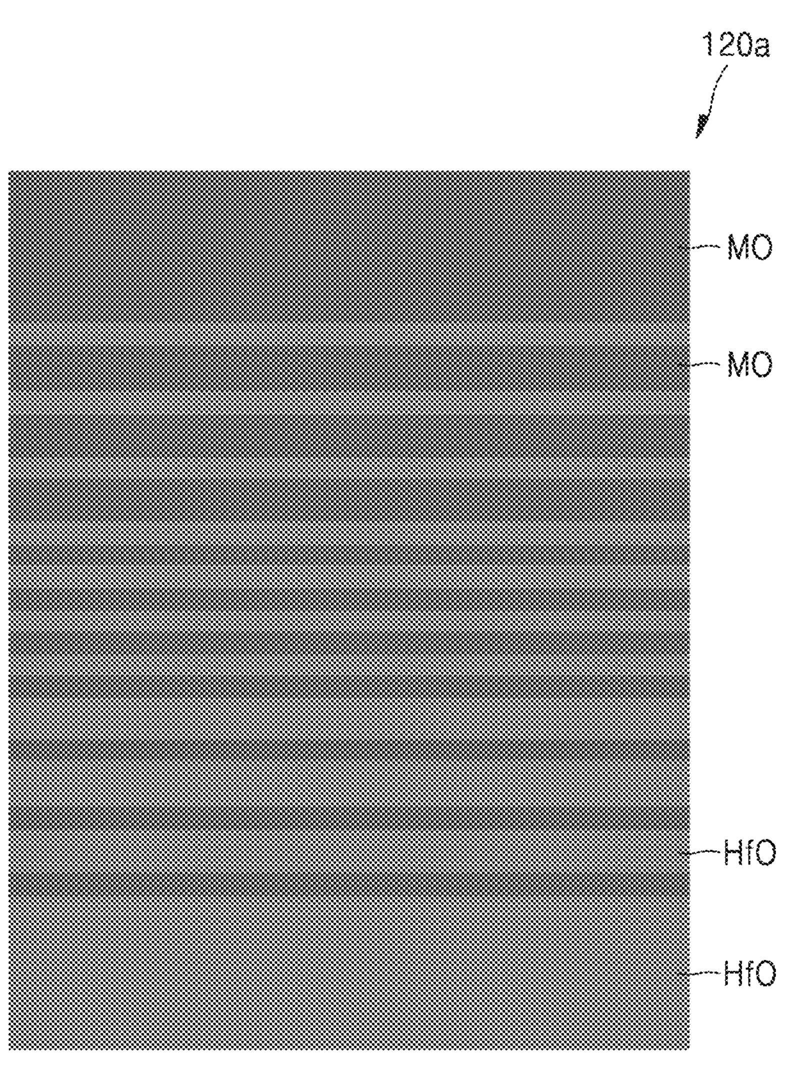
FIG. 5A is a diagram illustrating an example of a cross-section of a first ferroelectric layer applicable to the memory device illustrated in FIG. 1.

FIG. 5A illustrates a first ferroelectric layer 120*a* imprinted in the (−) voltage direction. In FIG. 5A, "MO" represents a metal oxide, and "Hf0" represents a metal dopant included in a hafnium oxide (HfO). Referring to FIG. 5A, the thickness of the hafnium oxide (HfO) layer may increase towards the lower portion of the first ferroelectric layer 120*a,* and the thickness of the metal oxide (MO) layer including the metal dopant may increase towards the upper portion of the first ferroelectric layer 120*a*. Accordingly, the first ferroelectric layer 120*a* imprinted in the (−) voltage direction may have a concentration gradient in which concentration of a dopant increases from the lower portion of the first ferroelectric layer 120*a* towards the upper portion of the first ferroelectric layer 120*a*.

Figure 5B:
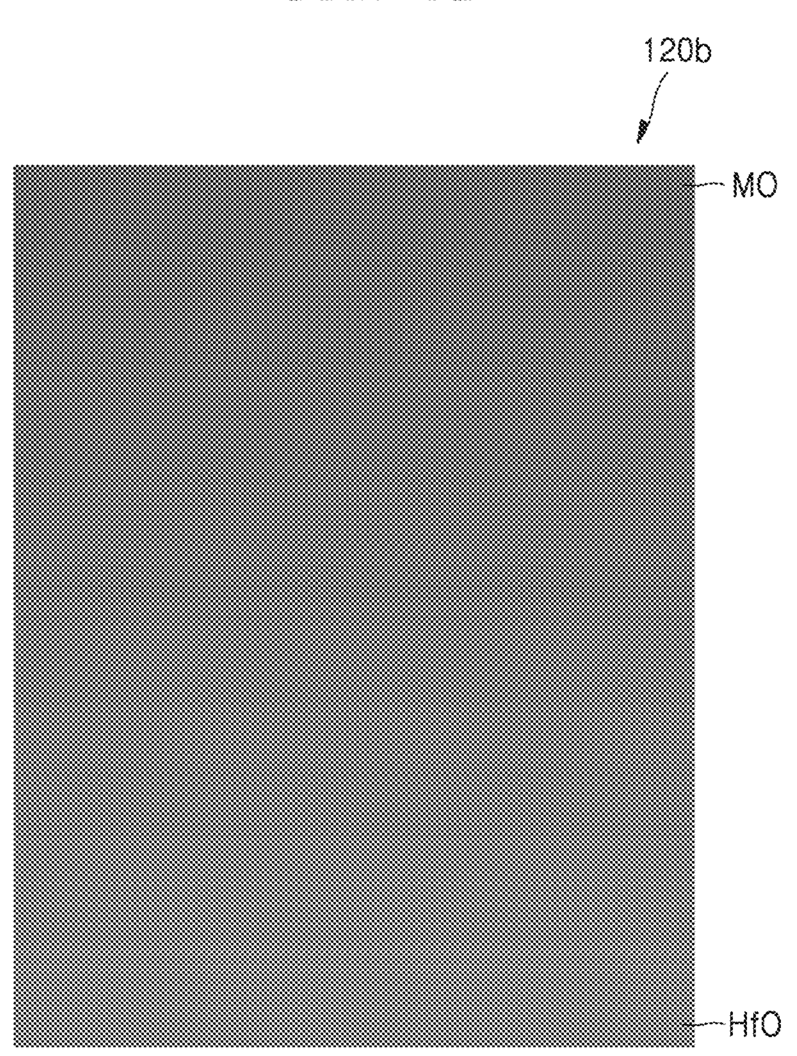
FIG. 5B is a diagram illustrating another example of a cross-section of a first ferroelectric layer applicable to the memory device illustrated in FIG. 1.

FIG. 5B illustrates a first ferroelectric layer 120*b* imprinted in the (−) voltage direction. The first ferroelectric layer 120*b* imprinted in the (−) voltage direction illustrated in FIG. 5B may have a concentration gradient continuously increasing (e.g., monotonically increasing) from the lower portion of the first ferroelectric layer 120*b*towards the upper portion of the first ferroelectric layer 120*b*. The first ferroelectric layer 120*b* illustrated in FIG. 5B may be formed by annealing the first ferroelectric layer 120*a* illustrated in FIG. 5A.

Figure 6A:
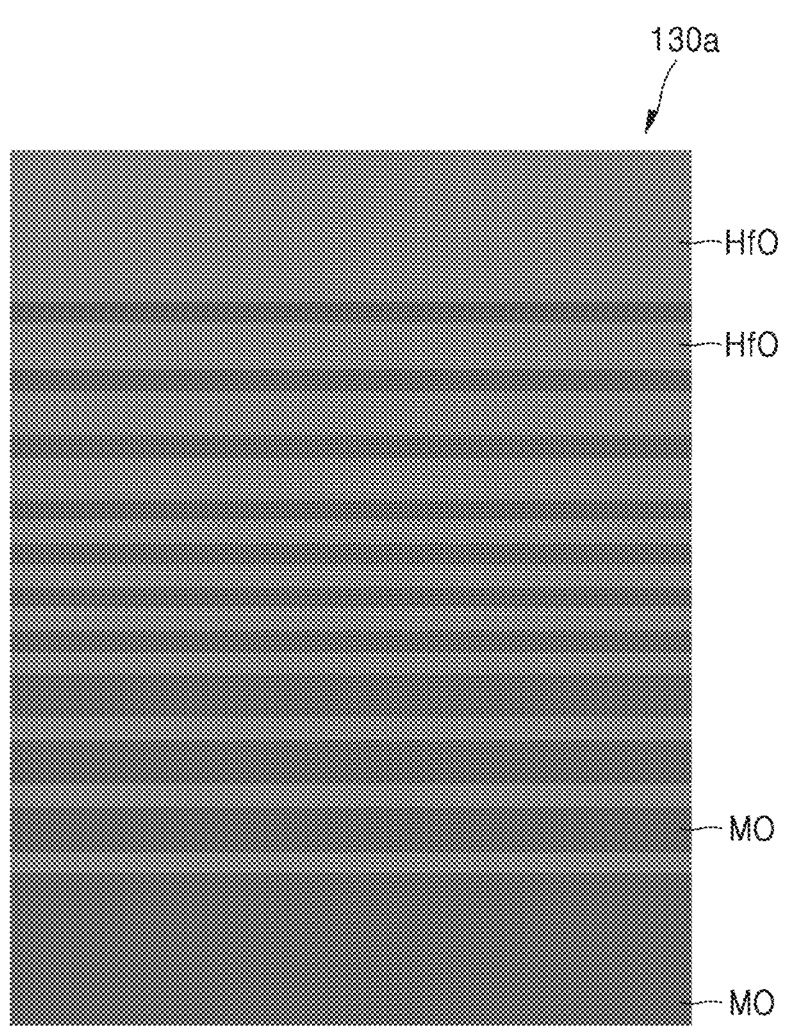
FIG. 6A is a diagram illustrating an example of a cross-section of a second ferroelectric layer applicable to the memory device illustrated in FIG. 1.

FIG. 6A illustrates a second ferroelectric layer 130*a* imprinted in the (+) voltage direction. Referring to FIG. 6A, the thickness of the hafnium oxide (HfO) layer may increase towards the upper portion of the second ferroelectric layer 130*a,* and the thickness of the metal oxide (MO) layer including the metal dopant may increase towards the lower portion of the second ferroelectric layer 130*a.* Accordingly, the second ferroelectric layer 130*a* imprinted in the (+) voltage direction may have a concentration gradient in which concentration of a dopant decreases from the lower portion of the second ferroelectric layer 130*a* towards the upper portion of the second ferroelectric layer 130*a*.

Figure 6B:
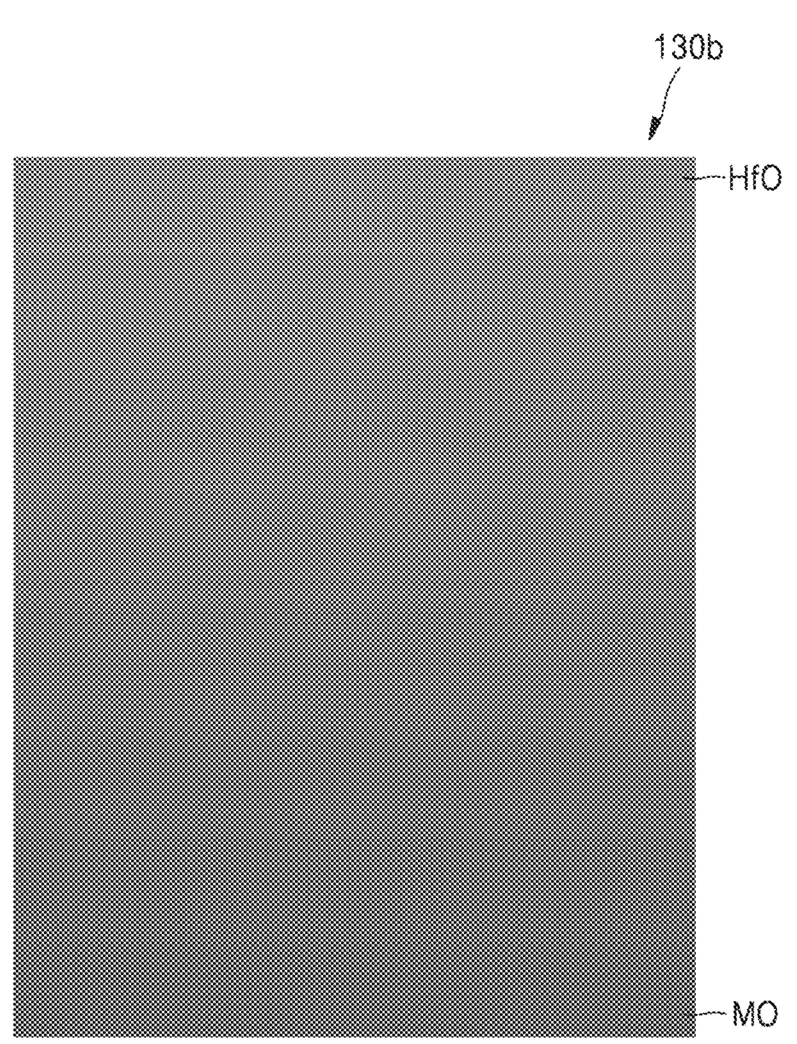
FIG. 6B is a diagram illustrating another example of a cross-section of a second ferroelectric layer applicable to the memory device illustrated in FIG. 1.

FIG. 6B illustrates a second ferroelectric layer 130*b* imprinted in the (+) voltage direction. The second ferroelectric layer 130*b* imprinted in the (+) voltage direction illustrated in FIG. 6B may have a concentration gradient continuously decreasing from the lower portion of the second ferroelectric layer 130*b* towards the upper portion of the second ferroelectric layer 130*b*. The second ferroelectric layer 130*b* illustrated in FIG. 6B may be formed by annealing the second ferroelectric layer 130*a* illustrated in FIG. 6A.

The foregoing embodiments describe the case in which, in the first ferroelectric layer (120*a* and 120*b*) imprinted in the (−) voltage direction, the doping concentration of a dopant increases from the lower portion towards the upper portion of the first ferroelectric layer (120*a* and 120*b*), and in the second ferroelectric layer (130*a* and 130*b*) imprinted in the (+) voltage direction, the doping concentration of a dopant decreases, e.g. decreases continuously or monastically, from the lower portion towards the upper portion of the second ferroelectric layer (130*a* and 130*b*). However, example embodiments are not limited thereto, and according to a charge state, in the first ferroelectric layer imprinted in the (−) voltage direction, the doping concentration of a dopant decreases from the lower portion to the upper portion of the first ferroelectric layer, and in the second ferroelectric layer imprinted in the (+) voltage direction, the doping concentration of a dopant increases from the lower portion to the upper portion of the second ferroelectric layer.

Figure 7:
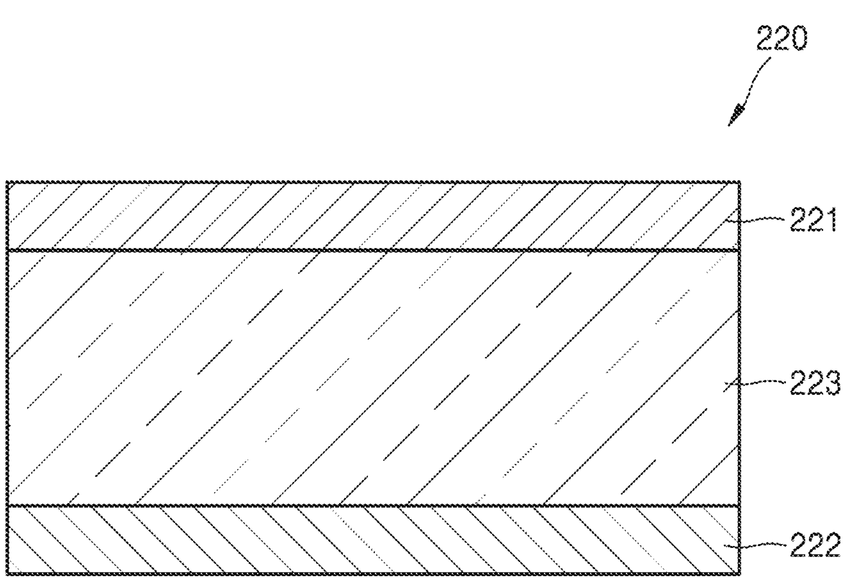
FIG. 7 is a diagram illustrating another example of a cross-section of a first ferroelectric layer applicable to the memory device illustrated in FIG. 1.
Figure 8:
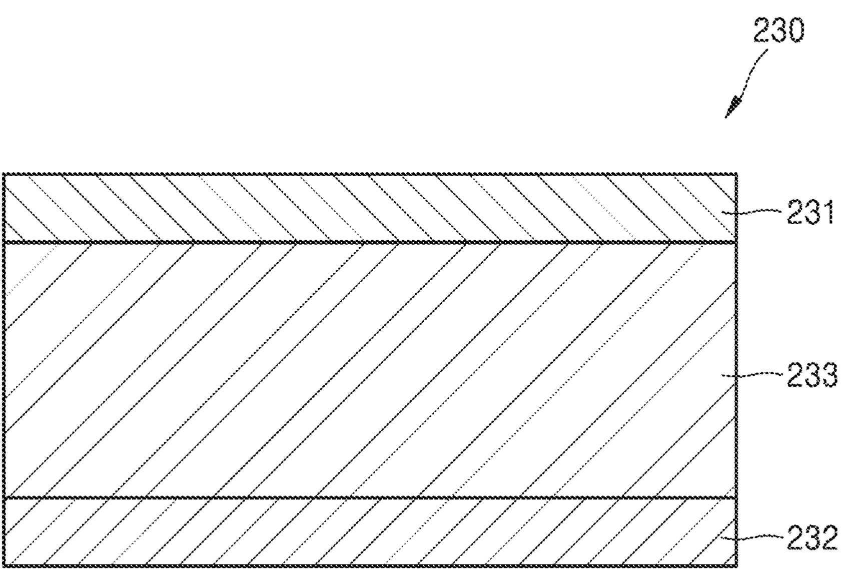
FIG. 8 is a diagram illustrating another example of a cross-section of a second ferroelectric layer applicable to the memory device illustrated in FIG. 1.

FIG. 7 illustrates a first ferroelectric layer 220 imprinted in the (−) voltage direction, and FIG. 8 illustrates a second ferroelectric layer 230 imprinted in the (+) voltage direction.

Referring to FIG. 7, the first ferroelectric layer 220 may include a first ferroelectric material layer 223 and first and second interface layers 221 and 222 respectively provided on upper and lower surfaces of the first ferroelectric material layer 223. The first ferroelectric material layer 223 may include, for example, one or more of a nitride-based material, perovskite, a fluorite-based material, etc., and may further include a certain dopant. The first interface layer 221 provided on the upper surface of the first ferroelectric material layer 223 and the second interface layer 222 provided on the lower surface of the first ferroelectric material layer 223 may include different materials from each other. The first and second interface layers 221 and 222 may each include, for example, at least one of $SiO_2$, $Al_2O_3$, $La_2O_3$, and $Y_2O_3$. For example, one of the first and second interface layers 221 and 222 may include $Al_2O_3$ and may not include $SiO_2$ and the other one may include $SiO_2$, and may not include $Al_2O_3$. However, the foregoing is provided only as an example.

By forming the first and second interface layers 221 and 222 including different materials from each other on the upper and lower surfaces of the first ferroelectric material layer 223, asymmetry of ferroelectricity may occur, and accordingly, the first ferroelectric layer 220 imprinted in the (−) voltage direction may be formed.

Referring to FIG. 8, the second ferroelectric layer 230 may include a second ferroelectric material layer 233 and third and fourth interface layers 231 and 232 respectively provided on upper and lower surfaces of the second ferroelectric material layer 233. The second ferroelectric material layer 233 may include a material identical to or different from the first ferroelectric material layer 223. The third interface layer 231 provided on the upper surface of the second ferroelectric material layer 233 and the fourth interface layer 232 provided on the lower surface of the second ferroelectric material layer 233 may include different materials from each other. The third and fourth interface layers 231 and 232 may each include, for example, at least one of $SiO_2$, $Al_2O_3$, $La_2O_3$, and $Y_2O_3$.

The fourth interface layer 232 formed on the lower surface the second ferroelectric material layer 233 and the first interface layer 221 formed on the upper surface of the first ferroelectric material layer 223 may include the same material. The third interface layer 231 formed on the upper surface of the second ferroelectric material layer 233 and the second interface layer 222 formed on the lower surface of the first ferroelectric material layer 223 may include the same material.

By forming the third and fourth interface layers 231 and 232 including different materials from each other on the upper and lower surfaces of the second ferroelectric material layer 233, asymmetry of ferroelectricity may occur, and accordingly, the second ferroelectric layer 230 imprinted in the (+) voltage direction may be formed.

Similar to the first and second ferroelectric layers 120 and 130 in FIG. 1, as the first and second ferroelectric material layers 223 and 233 have a doping concentration gradient in which concentration of a dopant varies in the thickness direction, asymmetry of ferroelectricity may further increase. For example, the first ferroelectric material layer 223 may have a concentration gradient in which doping concentration of a dopant increases from the lower portion towards the upper portion of the first ferroelectric material layer 223, and the second ferroelectric material layer 233 may have a concentration gradient in which doping concentration of a dopant decreases from the lower portion to the upper portion of the second ferroelectric material layer 233.

Figure 4B:
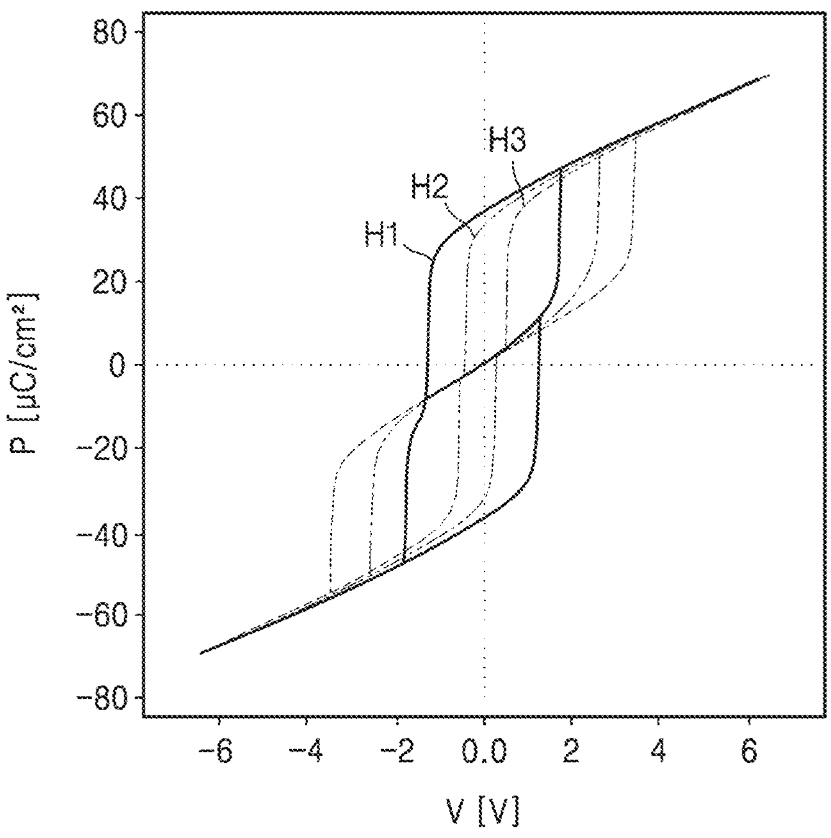
FIG. 4B is a diagram illustrating polarization (P)-voltage (V) characteristics of the lamination structure of the first and second ferroelectric layers of the capacitor illustrated in FIG. 4A.

FIG. 4B illustrates polarization (P)-voltage (V) characteristics of a lamination structure of the first and second ferroelectric layers 120 and 130 of the capacitor illustrated in FIG. 4A.

FIG. 4B shows hysteresis curves (H1, H2, and H3) of lamination structure of the first ferroelectric layer 120 imprinted in the (−) voltage direction and the second ferroelectric layer 130 imprinted in the (+) voltage direction. Each hysteresis curve may have combined characteristics of hysteresis characteristics of the first ferroelectric layer 120 imprinted in the (−) voltage direction and hysteresis characteristics of the second ferroelectric layer 130 imprinted in the (+) voltage direction. In the lamination structure of the first and second ferroelectric layers 120 and 130, the more the imprint degree of the first and second ferroelectric layers 120 and 130 increases, the more the hysteresis curve of the lamination structure of the first and second ferroelectric layers 120 and 130 moves towards "H3".

Figure 9:
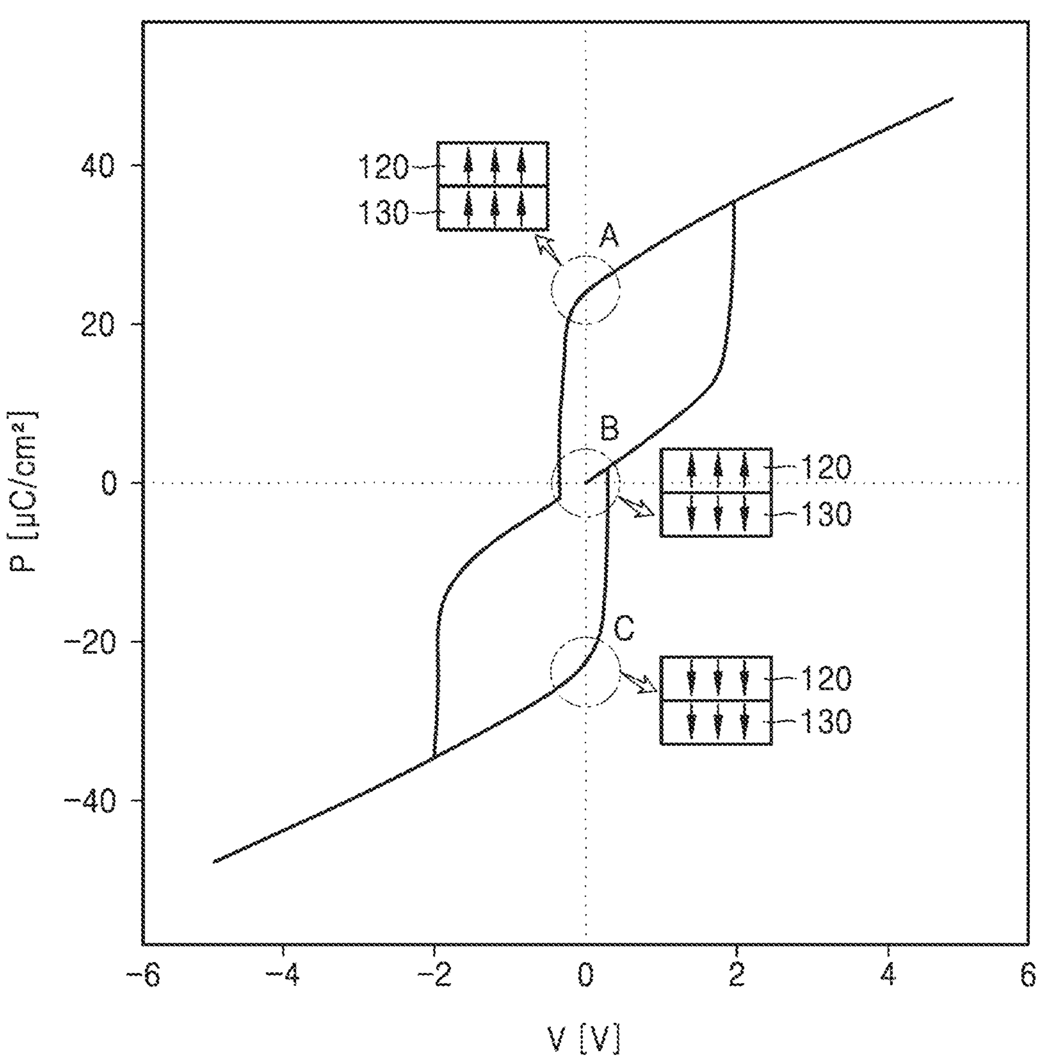
FIG. 9 is a diagram illustrating one of the polarization (P)-voltage (V) characteristics illustrated in FIG. 4B.

FIG. 9 is a diagram illustrating one of the polarization (P)-voltage (V) characteristics illustrated in FIG. 4B.

Referring to FIG. 9, when an applied voltage is 0 V, multi-bit functionality wherein a single cell has three levels of different polarization states, e.g., multi-bit functionally wherein a single memory cell has A, B, and C levels may be implemented. FIG. 9 illustrates a polarization state in the first and second ferroelectric layers 120 and 130 at each level (A, B, and C). For example, at the A level, both of the first and second ferroelectric layers 120 and 130 may have an upward polarization direction. At the B level, the first ferroelectric layer 120 may have an upward polarization direction, and the second ferroelectric layer 130 may have a downward polarization direction. At the C level, both of the first and second ferroelectric layers 120 and 130 may have a downward polarization direction.

As such, as the lamination structure of the first ferroelectric layer 120 imprinted in the (−) voltage direction and the second ferroelectric layer 130 imprinted in the (+) voltage direction is provided between the semiconductor substrate 101 and the gate electrode 170, multi-bit functionality having three levels in different polarization states may be implemented.

Figure 10:
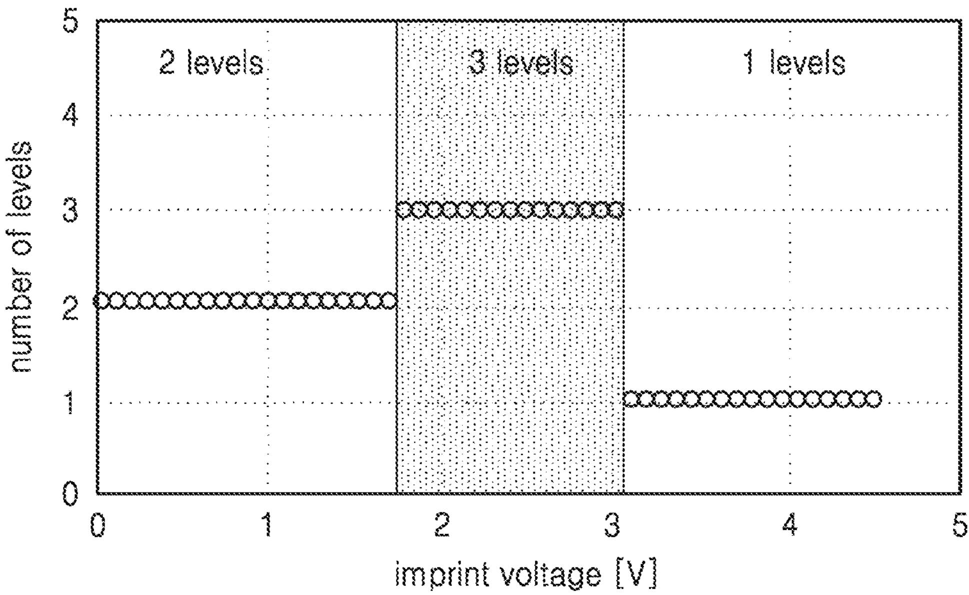
FIG. 10 is a diagram illustrating an example of the number of levels of the lamination structure of the first and second ferroelectric layers illustrated in FIG. 4A which may be implemented according to an imprint voltage.

FIG. 10 is a diagram illustrating an example of the number of levels of the lamination structure of the first and second ferroelectric layers 120 and 130 illustrated in FIG. 4A which may be implemented according to an imprint voltage. In FIG. 10, the "imprint voltage" refers to a voltage level moving along a voltage axis of a hysteresis curve.

Referring to FIG. 10, when the imprint voltage is less than 1.8 V, 2-level characteristics may be shown, and when the imprint voltage is about 1.8 V to about 3 V, 3-level characteristics may be implemented. When the imprint voltage is greater than 3 V, 1-level characteristics may be shown, which leads to loss of non-volatile characteristics.

As such, as the lamination structure of the first ferroelectric layer 120 imprinted in the (−) voltage direction and the second ferroelectric layer 130 imprinted in the (+) voltage direction is provided between the semiconductor substrate 101 and the gate electrode 170, multi-bit having a multi-level of three levels may be implemented.

Figure 11:
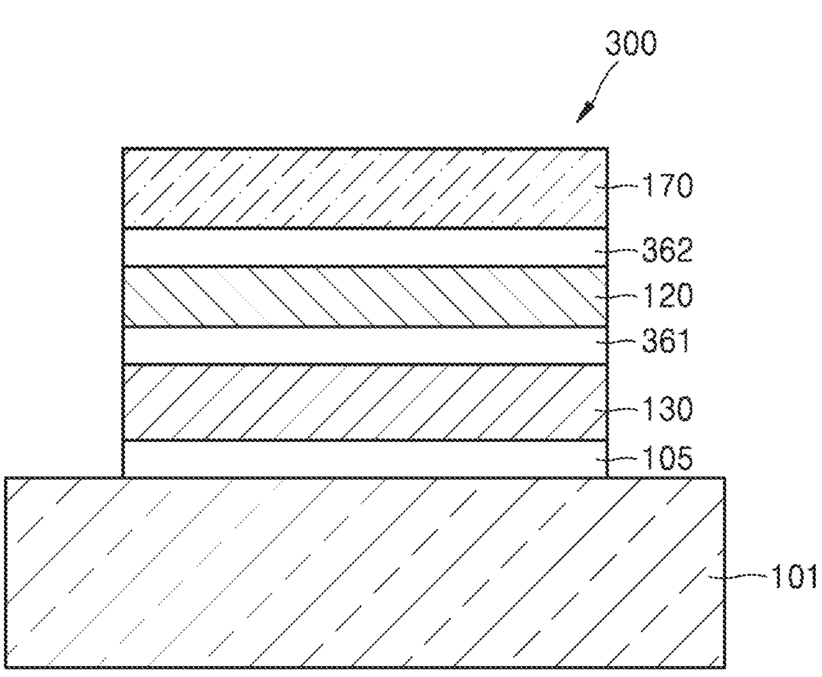
FIG. 11 is a cross-sectional view of a memory device according to various example embodiments.

FIG. 11 is a cross-sectional view of a memory device 300 according to various example embodiments. Hereinafter, differences from the above-described embodiments will be provided mainly.

Referring to FIG. 11, the memory device 300 may include the semiconductor substrate 101, the gate electrode 170, the first and second ferroelectric layers 120 and 130 laminated between the semiconductor substrate 101 and the gate electrode 170, and a paraelectric layer 361 provided between the first and second ferroelectric layers 120 and 130.

The first and second ferroelectric layers 120 and 130 may be laminated between the semiconductor substrate 101 and the gate electrode 170 in a direction perpendicular to the semiconductor substrate 101. The first and second ferroelectric layers 120 and 130 may include ferroelectric materials imprinted in opposite directions to each other. For example, the first ferroelectric layer 120 may include a ferroelectric layer imprinted in the (−) voltage direction, and the second ferroelectric layer 130 may include a ferroelectric layer imprinted in the (+) voltage direction. As the first and second ferroelectric layers 120 and 130 are already described above, any redundant description will be omitted.

The paraelectric layer 361 may be provided between the first and second ferroelectric layers 120 and 130. The paraelectric layer 361 may be provided to adjust ferroelectric characteristics of the first and second ferroelectric layers 120 and 130. The paraelectric layer 361 may include at least one of $SiO_2$, $Al_2O_3$, $La_2O_3$, and $Y_2O_3$ However, this is just an example, and the paraelectric layer 361 may include various other dielectric materials. A paraelectric layer 362 may be provided between the gate electrode 170 and the first ferroelectric layer 120.

Figure 12:
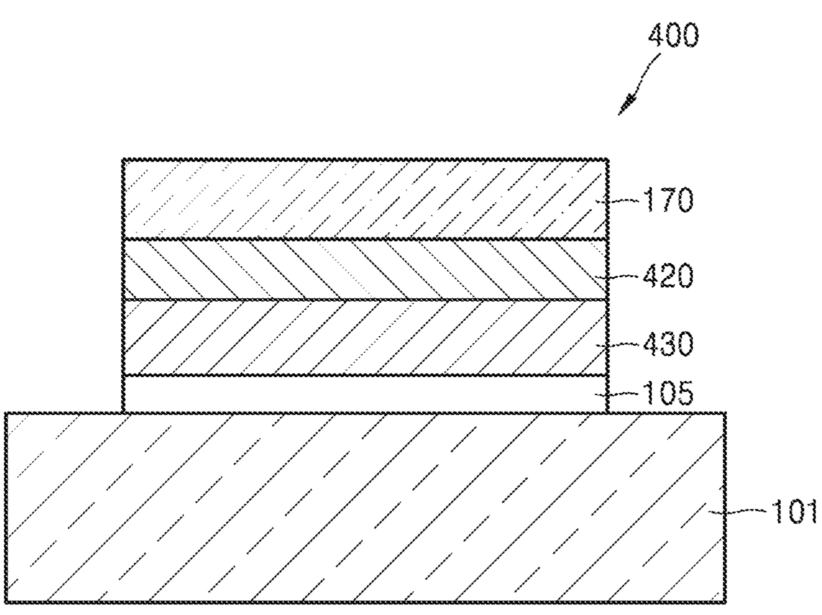
FIG. 12 is a cross-sectional view of a memory device according to various example embodiments.

FIG. 12 is a cross-sectional view of a memory device 400 according to various example embodiments. Hereinafter, differences from the above-described embodiments will be provided mainly.

Referring to FIG. 12, the memory device 400 may include the semiconductor substrate 101, the gate electrode 170, a first anti-ferroelectric layer 420 and a second anti-ferroelectric layer 430 laminated between the semiconductor substrate 101 and the gate electrode 170. The insulating layer 105 may be further provided on a surface of the semiconductor substrate 101. The gate electrode 170 may be provided on the semiconductor substrate 101.

The first and second anti-ferroelectric layers 420 and 430 may be laminated between the semiconductor substrate 101 and the gate electrode 170 in the direction perpendicular to the semiconductor substrate 101. The first and second anti-ferroelectric layers 420 and 430 may each include an anti-ferroelectric material including a certain dopant.

Anti-ferroelectric materials may include an array of electric dipoles, but the remnant polarization may be 0 or close to 0. As the directions of adjacent dipoles become opposite to each other when there is no electric field, which leads to offset of polarization, the overall spontaneous polarization and remnant polarization may be 0 or close to 0. However, when an external electric field is applied, polarization characteristics and switching characteristics may be shown.

The first and second anti-ferroelectric layers 420 and 430 may each include, for example, a nitride-based material, perovskite, or a fluorite-based material. The anti-ferroelectric material may have a different crystal structure from that of a ferroelectric material. For example, a crystal structure of a tetragonal system may have anti-ferroelectricity, and a crystal structure of an orthorhombic system may have ferroelectricity.

For example, the first and second anti-ferroelectric layers 420 and 430 may each include a zirconium oxide injected with a certain dopant. The dopant may include, for example, at least one of Al, Ga, Co, Ni, Mg, In, La, Y, Nd, Sm, Er, Sr, Ba, Gd, Ge, N, and Si. However, this is only an example.

The first and second anti-ferroelectric layers 420 and 430 may each include an imprinted anti-ferroelectric material. The "imprint of anti-ferroelectric material" refers to a phenomenon in which hysteresis characteristics of an anti-ferroelectric material move along a voltage axis in a polarization (P)-voltage (V) characteristics curve of the anti-ferroelectric material. The imprint of anti-ferroelectric material includes a (−) imprint which involves hysteresis characteristics of an anti-ferroelectric material moving in the (−) voltage direction and a (+) imprint which involves hysteresis characteristics of an anti-ferroelectric material moving in the (+) voltage direction. Such imprint of anti-ferroelectric material may be caused by asymmetry of anti-ferroelectricity of an anti-ferroelectric material. The asymmetry of anti-ferroelectricity may occur when a doping concentration gradient is generated due to change of dopant concentration according to a position in an anti-ferroelectric material and/or to a formation of different material layers at upper and lower interfaces of the anti-ferroelectric material. The greater the asymmetry of anti-ferroelectricity in an anti-ferroelectric material is, the greater the imprint of the ferroelectric material may be.

The first and second anti-ferroelectric layers 420 and 430 may include anti-ferroelectric materials imprinted in opposite directions to each other. More specifically, the first anti-ferroelectric layer 420 may include an anti-ferroelectric layer imprinted in the (−) voltage direction, and the second anti-ferroelectric layer 430 may include an anti-ferroelectric layer imprinted in the (+) voltage direction. As such, as the lamination structure of the first and second anti-ferroelectric layers 420 and 430 imprinted in opposite directions to each other is provided between the semiconductor substrate 101 and the gate electrode 170, multi-bit may be implemented.

Although it is not shown in the drawings, a paraelectric layer for adjusting paraelectric characteristics may be further provided between the first and second anti-ferroelectric layers 420 and 430, and a paraelectric layer may also be provided between the gate electrode 170 and the first anti-ferroelectric layer 420.

Figure 13:
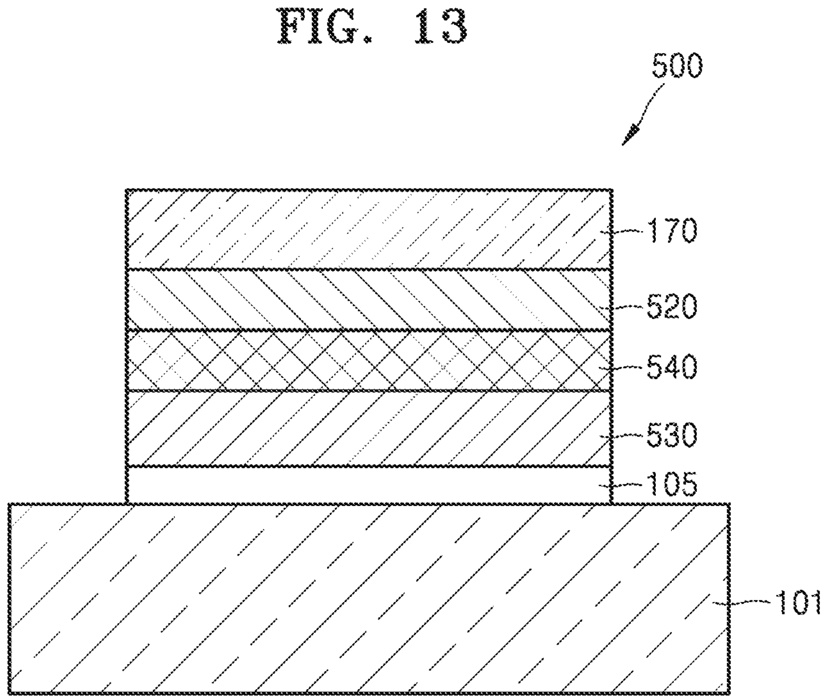
FIG. 13 is a cross-sectional view of a memory device according to various example embodiments.

FIG. 13 is a cross-sectional view of a memory device 500 according to various example embodiments. Hereinafter, differences from the above-described embodiments will be provided mainly.

Referring to FIG. 13, the memory device 500 may include the semiconductor substrate 101, the gate electrode 170, a first anti-ferroelectric layer 520, a second anti-ferroelectric layer 530, and a third anti-ferroelectric layer 540 laminated between the semiconductor substrate 101 and the gate electrode 170. The first to third ferroelectric layers 520, 530, and 540 may be laminated between the semiconductor substrate 101 and the gate electrode 170 in the direction perpendicular to the semiconductor substrate 101.

The first and second ferroelectric layers 520 and 530 respectively provided on upper and lower surfaces of the third ferroelectric layer 540 may include ferroelectric materials imprinted in opposite directions to each other. For example, the first ferroelectric layer 520 may include a ferroelectric layer imprinted in the (−) voltage direction, and the second ferroelectric layer 530 may include a ferroelectric layer imprinted in the (+) voltage direction. The third ferroelectric layer 540 may include an unimprinted ferroelectric material. Although FIG. 13 illustrates the case in which the first to third ferroelectric layers 520, 530, and 540 are sequentially laminated on a lower surface of the gate electrode 170, this is just an example, and the lamination order of the first to third ferroelectric layers 520, 530, and 540 may vary.

As such, as the memory device 500 includes the first and second ferroelectric layers 520 and 530 imprinted in opposite directions to each other and the lamination structure of three ferroelectric layers (520, 530, and 540) including the unimprinted third ferroelectric layer 540, multi-bit having multi-level characteristics of maximum 4 levels may be implemented. Accordingly, more information (e.g., more logic levels) may be stored in the memory device 500.

Figure 14A:
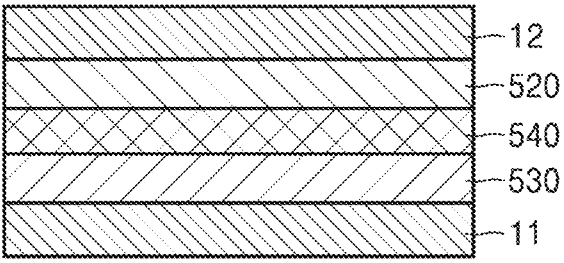
FIG. 14A is a diagram of a capacitor including a lamination structure of a first ferroelectric layer, a second ferroelectric layer, and a third ferroelectric layer illustrated in FIG. 13.

FIG. 14A is a diagram of a capacitor including a lamination structure of the first ferroelectric layer 520, the second ferroelectric layer 530, and the third ferroelectric layer 540 illustrated in FIG. 13.

FIG. 14A illustrates a capacitor including a lamination structure of the first ferroelectric layer 520 imprinted in the (−) voltage direction, the second ferroelectric layer 530 imprinted in the (+) voltage direction, and the unimprinted third ferroelectric layer 540 between the two metal electrodes 11 and 12.

Figure 14B:
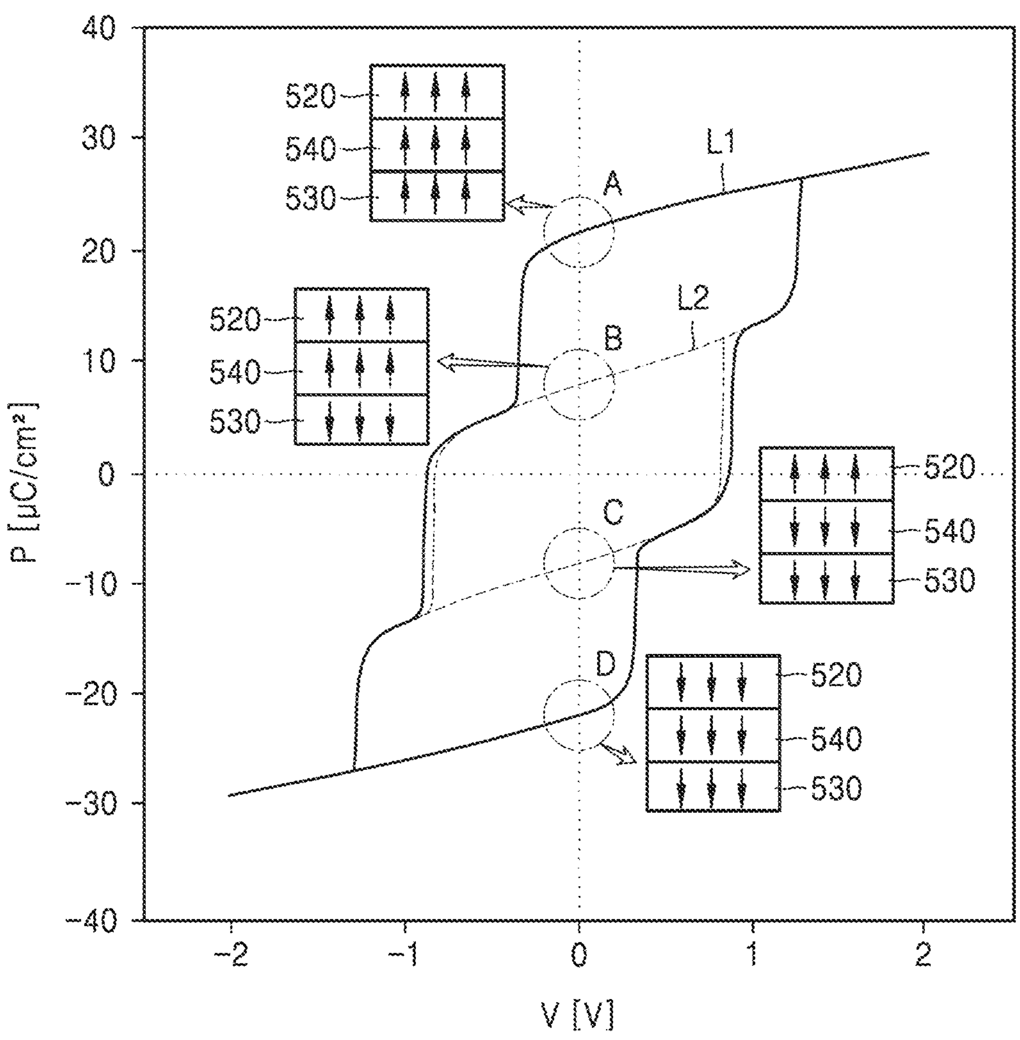
FIG. 14B is a diagram illustrating polarization (P)-voltage (V) characteristics of the lamination structure of the first, second, and third ferroelectric layers illustrated in FIG. 14A.

FIG. 14B is a diagram illustrating polarization (P)-voltage (V) characteristics of the lamination structure of the first, second, and third ferroelectric layers 520, 530, and 540 illustrated in FIG. 14A. In FIG. 14B, "L1" represents a hysteresis curve which may be obtained when a voltage, e.g., a maximum applied voltage is about 2 V, and "L2" represents a hysteresis curve which may be obtained when a voltage, e.g., a maximum applied voltage is about 1 V.

Referring to FIG. 14B, in the capacitor illustrated in FIG. 14A, when the applied voltage is 0 V, four levels (i.e., A, B, C, and D levels) having different polarization states may be implemented. More specifically, when the applied voltage is about 2 V to 0 V, A and D levels may be implemented by the "L1" hysteresis curve, and when the applied voltage is about 1 V to 0 V, B and C levels may be implemented by the "L2" hysteresis curve. FIG. 14B illustrates a polarization state in the first to third ferroelectric layers 520, 530, and 540 at each level (A, B, C, and D). As such, in the lamination structure including three ferroelectric layers (520, 530, and 540), by adjusting a maximum applied voltage, four levels having different polarization states may be implemented.

Figure 15:
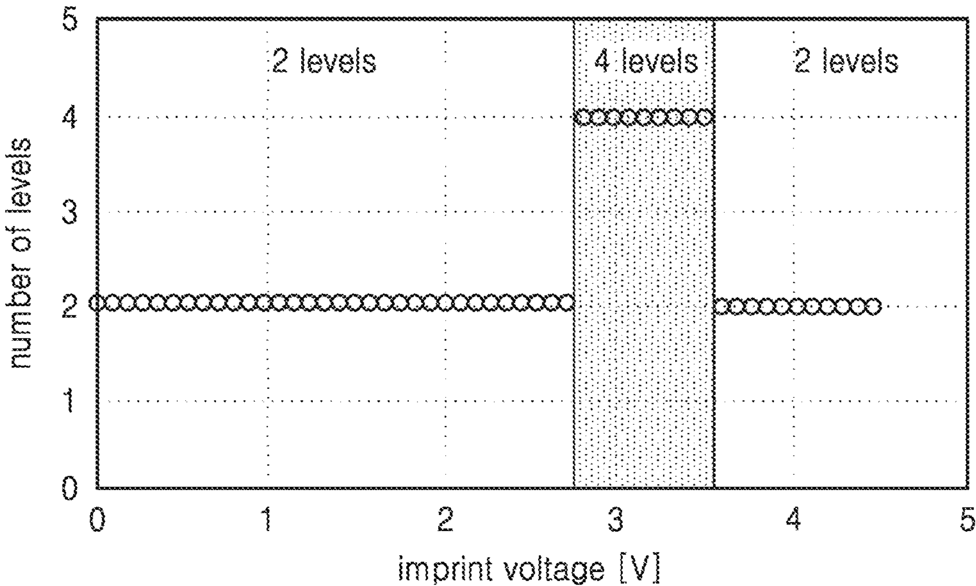
FIG. 15 is a diagram illustrating an example of the number of levels of the lamination structure of the first, second, and third ferroelectric layers illustrated in FIG. 14A which may be implemented according to an imprint voltage.

FIG. 15 is a diagram illustrating an example of the number of levels of the lamination structure of the first to third ferroelectric layers 520, 530, and 540 illustrated in FIG. 14A which may be implemented according to an imprint voltage.

Referring to FIG. 15, when the imprint voltage is less than 2.8 V, 2-level characteristics may be shown, and when the imprint voltage is about 2.8 V to about 3.5 V, 4-level characteristics may be implemented. When the imprint voltage is greater than 3.5 V, 2-level characteristics may be shown. Accordingly, in the memory device 500 including the lamination structure including the first to third ferroelectric layers 520, 530, and 540, by adjusting the imprint voltage, 4-level characteristics may be implemented.

The foregoing example embodiments describe the case in which the memory device 500 includes the lamination structure of the first to third ferroelectric layers 520, 530, and 540; however, the memory device 500 may include a lamination structure of first to third anti-ferroelectric layers. The first and second anti-ferroelectric layers may include anti-ferroelectric materials imprinted in opposite directions to each other, and the third anti-ferroelectric layer may include an unimprinted anti-ferroelectric material.

Figure 16:
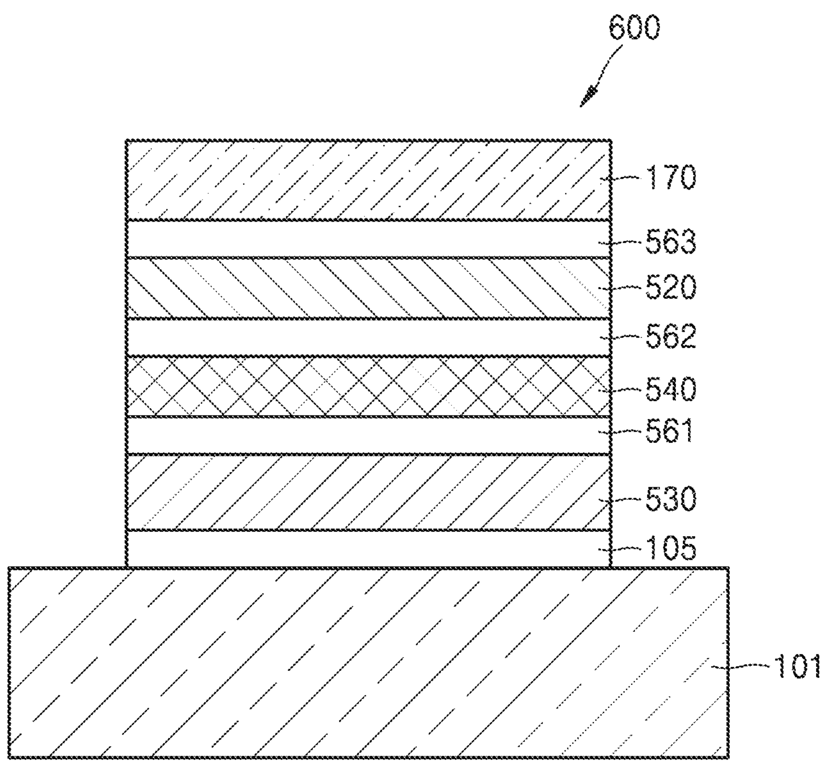
FIG. 16 is a cross-sectional view of a memory device according to various example embodiments.

FIG. 16 is a cross-sectional view of a memory device 600 according to various example embodiments.

Referring to FIG. 16, the memory device 600 may include the semiconductor substrate 101, the gate electrode 170, the first to third ferroelectric layers 520, 530, and 540 laminated between the semiconductor substrate 101 and the gate electrode 170, and paraelectric layers 561 and 562 provided between the first to third ferroelectric layers 520, 530, and 540.

The first to third ferroelectric layers 520, 530, and 540 are the same as the first to third ferroelectric layers 520, 530, and 540 illustrated in FIG. 13. The first and second ferroelectric layers 520 and 530 may include ferroelectric materials imprinted in opposite directions to each other, and the third ferroelectric layer 540 may include an unimprinted ferroelectric material.

The paraelectric layers 561 and 562 may be provided between the first and second ferroelectric layers 520 and 530 and between the second and third ferroelectric layers 530 and 540 to adjust ferroelectric characteristics. The paraelectric layers 561 and 562 may independently or concurrently include at least one of $SiO_2$, $Al_2O_3$, $La_2O_3$, and $Y_2O_3$. A paraelectric layer 563 may be provided between the gate electrode 170 and the first ferroelectric layer 520. Thicknesses of each of the paraelectric layers 561, 562, and 563 may be the same; alternatively a thickness of any one of the paraelectric layers 561, 562, and 563 may be different form another of the paraelectric layers 561, 562, and 563. Although example embodiments describe the cases in which the paraelectric layers 561 and 562 are provided between every adjacent ferroelectric layers (520, 530, and 540), the paraelectric layer may be provided at one of areas between the adjacent ferroelectric layers (520, 530, and 540).

Figure 17:
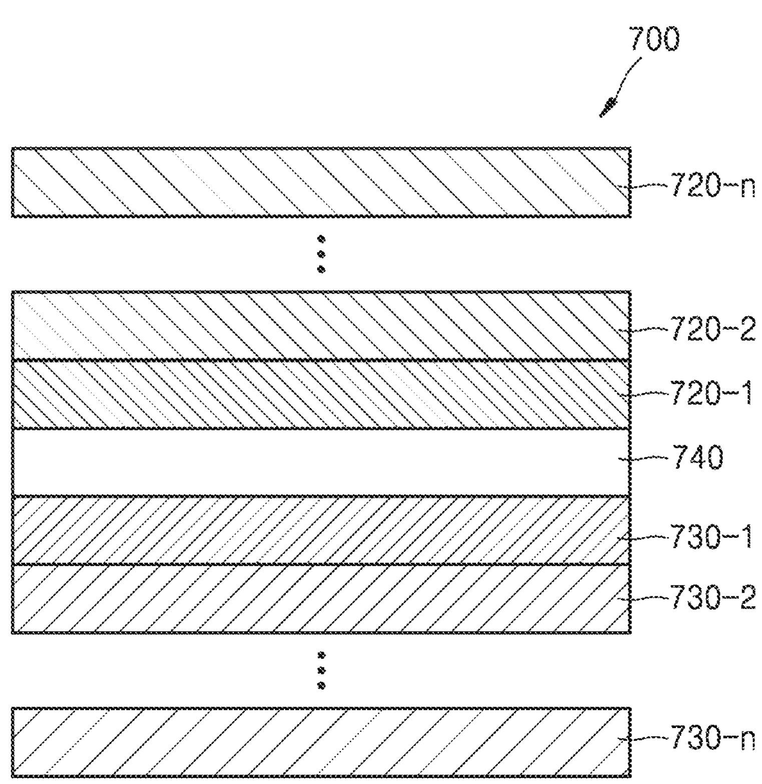
FIG. 17 is a cross-sectional view of a memory device according to various example embodiments.

FIG. 17 is a cross-sectional view of a memory device 700 according to various example embodiments. FIG. 17 only illustrates a lamination structure provided between the semiconductor substrate 101 and the gate electrode 170 for convenience sake.

Referring to FIG. 17, the memory device 700 may include a plurality of ferroelectric layers laminated between the semiconductor substrate 101 and the gate electrode 170. The plurality of ferroelectric layers may include a plurality of first ferroelectric layers (720-1, 720-2, . . . , 720-*n*), a plurality of second ferroelectric layers (730-1, 730-2, . . . , 730-*n*), and a third ferroelectric layer 740.

The first ferroelectric layers (720-1, 720-2, . . . , 720-*n*) and the second ferroelectric layers (730-1, 730-2, . . . , 730-*n*) may include ferroelectric materials imprinted in opposite directions to each other. For example, the first ferroelectric layers (720-1, 720-2, . . . , 720-*n*) may be imprinted in the (−) voltage direction, and include ferroelectric materials having different imprint degrees from each other. The second ferroelectric layers (730-1, 730-2, . . . , 730-*n*) may be imprinted in the (+) voltage direction, and include ferroelectric materials having different imprint degrees from each other. The third ferroelectric layer 740 may include an unimprinted ferroelectric material.

FIG. 17 illustrates an example of a lamination structure including 2n+1 ferroelectric layers including n first ferroelectric layers (720-1, 720-2, . . . , 720-*n*), n second ferroelectric layers (730-1, 730-2, . . . , 730-*n*), and one third ferroelectric layer 740. The memory device 700 including the lamination structure illustrated in FIG. 17 may implement a maximum of 2n+2 levels. When the memory device 700 further includes an additional material layer in addition to the aforementioned ferroelectric layers, the memory device 700 may implement 2n+2 levels or more.

The lamination order of ferroelectric layers illustrated in FIG. 17 is just an example and may vary. The foregoing example embodiments illustrate the case in which the memory device 700 includes a plurality of ferroelectric layers; however, the memory device 700 may include a plurality of anti-ferroelectric layers.

Figure 18:
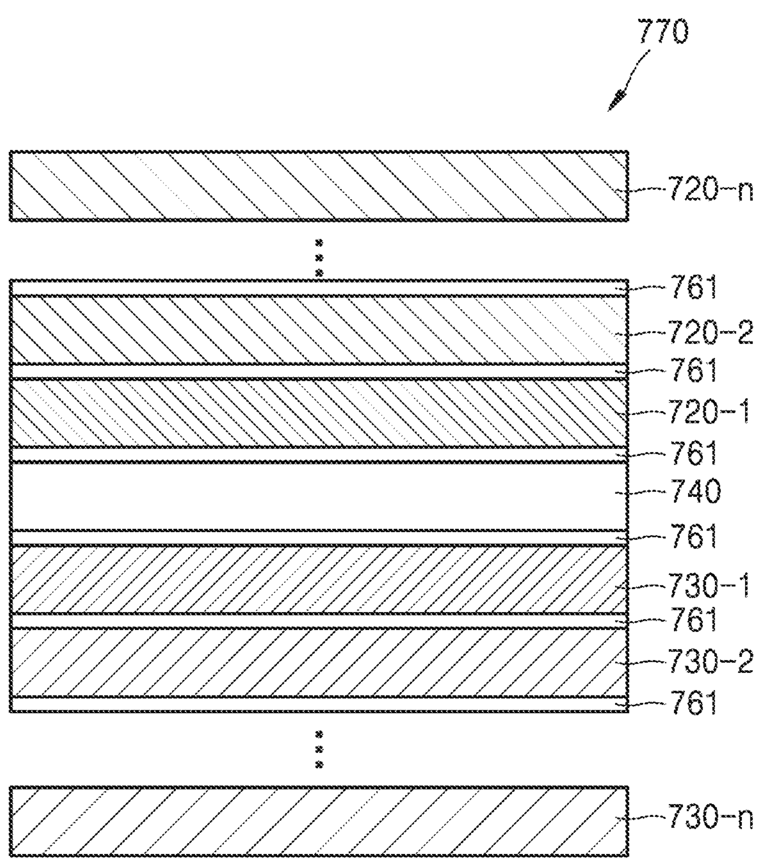
FIG. 18 is a cross-sectional view of a memory device according to various example embodiments.

FIG. 18 is a cross-sectional view of a memory device 770 according to various example embodiments. FIG. 18 only illustrates a lamination structure provided between the semiconductor substrate 101 and the gate electrode 170 for convenience sake.

Referring to FIG. 18, the memory device 770 may include a plurality of ferroelectric layers laminated between the semiconductor substrate 101 and the gate electrode 170 and a plurality of paraelectric layers 761. The plurality of ferroelectric layers may include a plurality of first ferroelectric layers (720-1, 720-2, . . . , 720-*n*), a plurality of second ferroelectric layers (730-1, 730-2, . . . , 730-*n*), and a third ferroelectric layer 740, which are already described in the aforementioned embodiments.

The plurality of paraelectric layers 761 may be provided between the plurality of ferroelectric layers to adjust ferroelectric characteristics. The paraelectric layers 761 may independently or concurrently include at least one of $SiO_2$, $Al_2O_3$, $La_2O_3$, and $Y_2O_3$; however, example embodiments are not limited thereto. FIG. 18 illustrates the case in which the paraelectric layers 761 are provided between every adjacent ferroelectric layers. However, example embodiments are not limited thereto, and the paraelectric layers 761 may be provided between some of areas between adjacent ferroelectric layers.

The aforementioned memory devices (i.e., FEFET) may be employed in various electronic apparatuses. For example, the memory devices may be used as a memory cell, a plurality of memory cells may be arranged in a 2D manner, arranged in vertical or horizontal direction, or arranged in one direction to form a memory string cell, and a plurality of memory string cells may be arranged in a 2D manner, etc. to form a memory cell array. The aforementioned memory devices may be a part of an electronic circuit constituting an electronic apparatus, along with other circuit elements.

Figure 19:
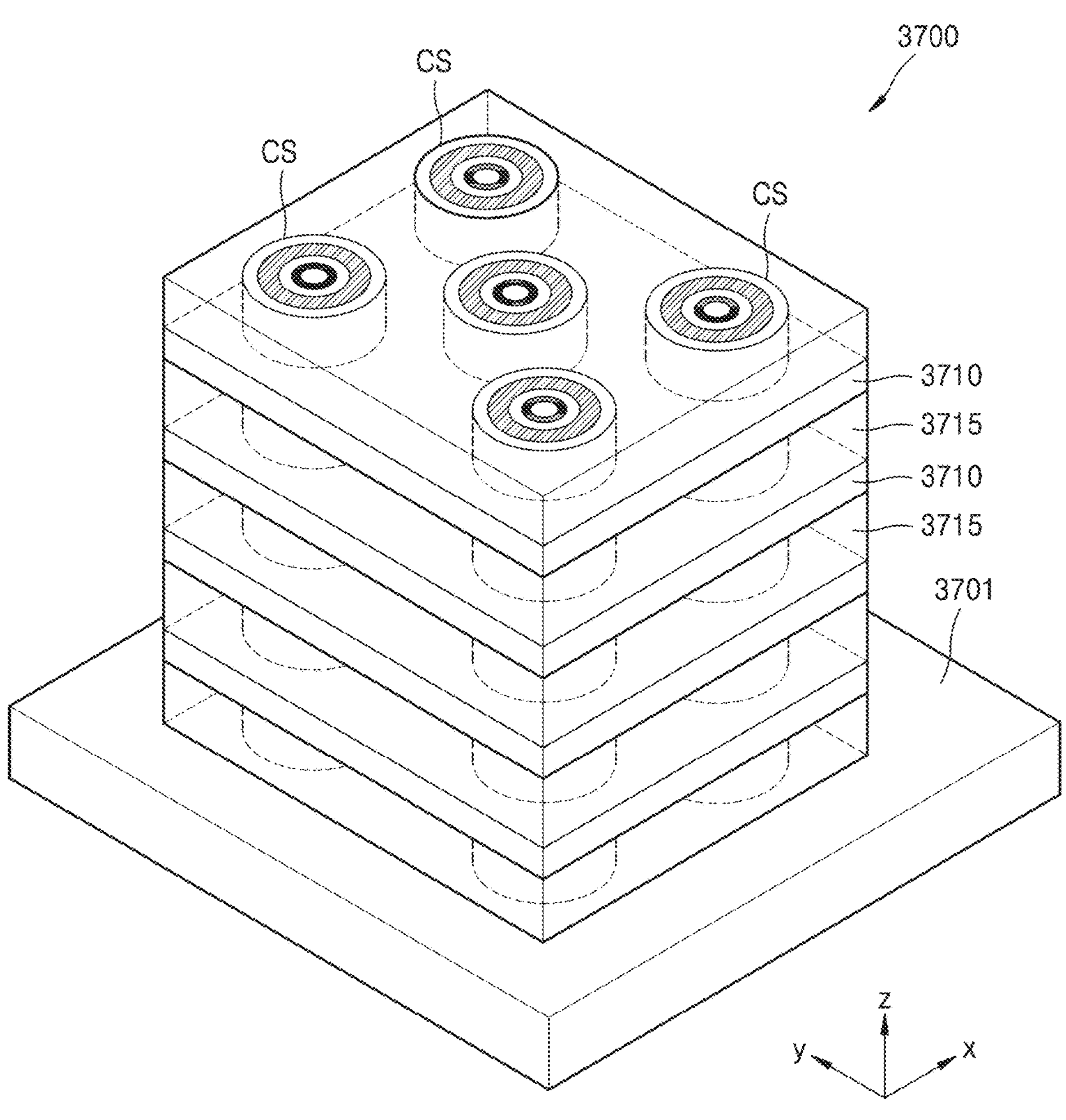
FIG. 19 is a perspective view schematically illustrating a memory apparatus according to some example embodiments.
Figure 20:
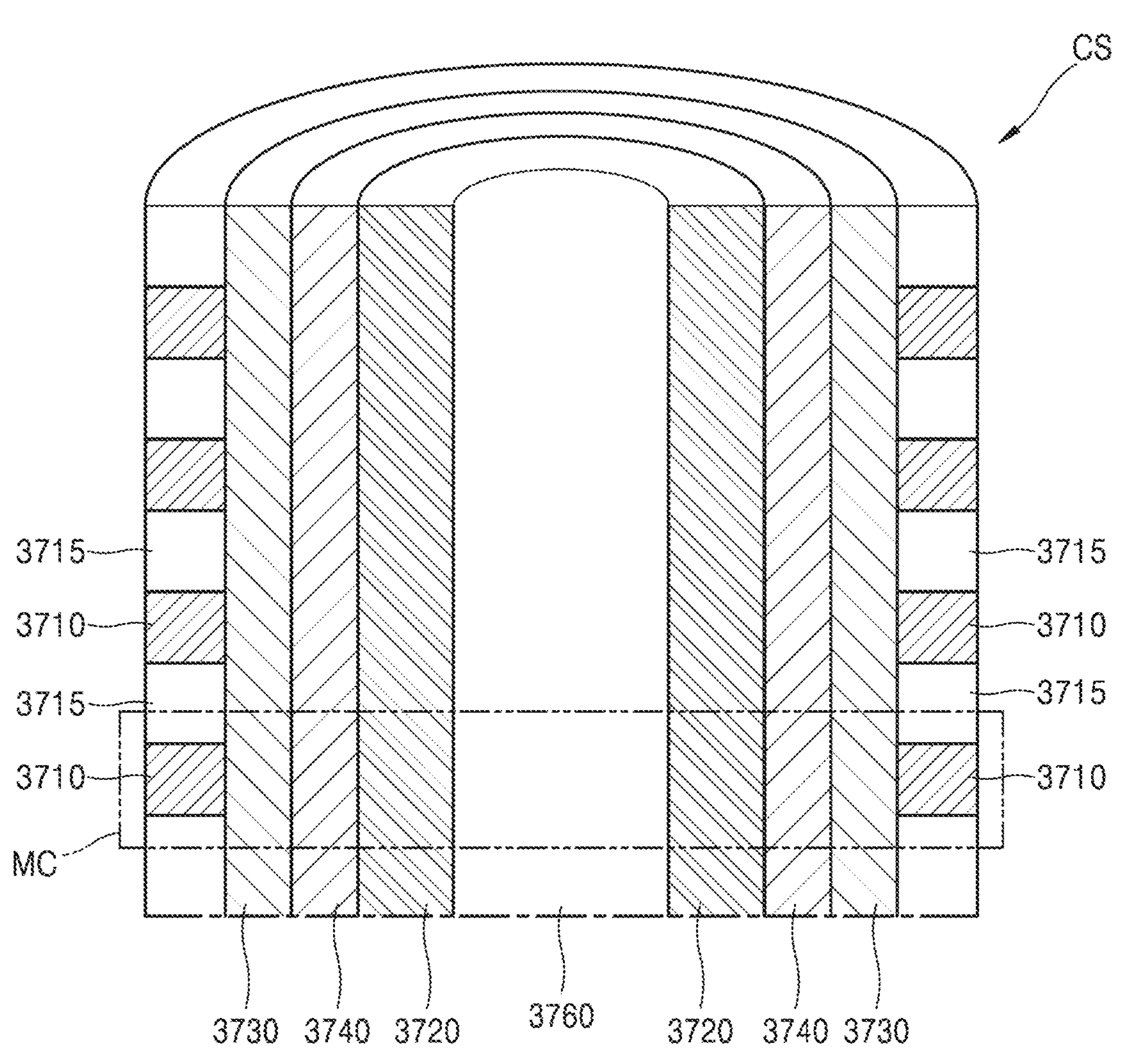
FIG. 20 is a diagram illustrating a cross-section of a cell string of the memory apparatus illustrated in FIG. 19.

FIG. 19 is a perspective view schematically illustrating a memory apparatus 3700 according to some example embodiments. The memory apparatus 3700 illustrated in FIG. 19 may be a vertical non-volatile memory apparatus (for example, VNAND apparatus). FIG. 20 is a diagram illustrating a cross-section of a cell string CS of the memory apparatus 3700 illustrated in FIG. 19.

Referring to FIGS. 19 and 20, the memory apparatus 3700 may include a plurality of cell strings CS arranged on a substrate 3701. Each cell string CS may extend in a direction perpendicular to the substrate 3701 (z-axis direction). The plurality of cell strings CS may be arranged in various forms on the substrate 3701.

Each cell string CS may include a plurality of memory cells MC laminated in the direction perpendicular to the substrate 3701 (z-axis direction). Each memory cell MC may have the same configuration as the memory devices (100, 300, 400, 500, 600, and 700) according to the aforementioned embodiments.

The substrate 3701 may include various materials. For example, the substrate 3701 may include a single-crystal silicon substrate, a compound semiconductor substrate, or silicon-on-insulator (SOI) substrate; however, example embodiments are not limited thereto. The substrate 3701 may further include, for example, an impurity area due to doping, an electronic device such as a transistor, etc., a periphery circuit which selects and controls memory cells storing data, etc.

A plurality of gate electrodes 3710 may be laminated apart from each other in a direction perpendicular to the substrate 3701. Each gate electrode 3710 may extend in a direction parallel with the substrate 3701. The gate electrode 3710 is to control corresponding channel layer 3720, and a word line may be electrically connected to the gate electrode 3710. A voltage turning on/off the corresponding channel layer 3720 may be selectively applied to the gate electrode 3710.

The gate electrode 3710 may include a conductive material such as a metal, a metal nitride, a metal oxide, polysilicon such as doped polysilicon, etc. However, this is just an example, and the gate electrode 3710 may include various other conductive materials. A plurality of interlayer-insulating layers 3715 may be laminated between the gate electrodes 3710 in the direction perpendicular to the substrate 3701. The interlayer-insulating layers 3715 malfunction as spacer layers for insulation between the gate electrodes 3710. The interlayer-insulating layers 3715 may each include, for example, a silicon oxide, a silicon nitride, etc.; however, example embodiments are not limited thereto.

A plurality of ferroelectric layers 3730 and 3740 and the channel layer 3720 may be sequentially provided on the inner surface of the gate electrode 3710. The plurality of ferroelectric layers 3730 and 3740 and the channel layer 3720 may each extend perpendicular to the substrate 3701 and may be shared by the plurality of memory cells MC. A source and a drain may be provided under and on the channel layer 3720, and the source and the drain may be connected to a common source line and a bit line.

A through hole penetrating the gate electrodes 3710 and the interlayer-insulating layers 3715 may be formed in the direction perpendicular to the substrate 3701, and the through hole may be formed to have, for example, a circular cross-section. The plurality of ferroelectric layers 3730 and 3740 and the channel layer 3720 may be sequentially provided on the inner wall of the through hole in the direction parallel with the substrate 3701. The plurality of ferroelectric layers 3730 and 3740 and the channel layer 3720 may each have a cylindrical shape extending in the direction perpendicular to the substrate 3701.

The channel layer 3720 may include a semiconductor material. For example, the channel layer 3720 may include a Group IV semiconductor such as Si, Ge, SiGe, etc., or include a Groups III-V semiconductor compound. The channel layer 3720 may 3720 may include, for example, an oxide semiconductor, a nitride semiconductor, an oxynitride semiconductor, a 2D semiconductor material, a quantum dot, or an organic semiconductor. The oxide semiconductor may include, for example, InGaZnO, etc., the 2D semiconductor material may include, for example, TMD or graphene, and the quantum dot may include a colloidal quantum dot, a nanocrystal structure, etc. However, this is just an example, and example embodiments are not limited thereto.

The channel layer 3720 may further include a dopant. The dopant may include a p-type dopant or an n-type dopant. The p-type dopant may include, for example, a Group III element, such as B, Al, Ga, In, etc., and the n-type dopant may include, for example, a Group V element, such as P, As, Sb, etc. A filling insulating layer 3760 be provided on an inner surface of the channel layer 3720 to fill the through hole. The filling insulating layer 3760 may include, for example, a silicon oxide, air, etc.; however, example embodiments are not limited thereto.

The plurality of ferroelectric layers 3730 and 3740 may be provided between the gate electrode 3710 and the channel layer 3720. The plurality of ferroelectric layers 3730 and 3740 may include a first ferroelectric layer 3730 and a second ferroelectric layer 3740 laminated in the direction parallel with the substrate 3701. The first and second ferroelectric layers 3730 and 3740 may be the first and second ferroelectric layers 120 and 130 illustrated in FIG. 1. Accordingly, any redundant description thereon is omitted.

The first and second ferroelectric layers 3730 and 3740 may each include, a nitride-based material, perovskite, a fluorite-based material etc. The first and second ferroelectric layers 3730 and 3740 may each include a certain dopant. For example, the first and second ferroelectric layers 3730 and 3740 may each include a hafnium oxide injected with a dopant including at least one of Zr, La, Al, Si, and Y. For example, the first and second ferroelectric layers 3730 and 3740 may each include an aluminum nitride injected with a dopant including at least one of B and Sc.

The first and second ferroelectric layers 3730 and 3740 may each include an imprinted ferroelectric material. The first and second ferroelectric layers 3730 and 3740 may include ferroelectric materials imprinted in opposite directions to each other. For example, the first ferroelectric layer 3730 may include a ferroelectric layer imprinted in the (−) voltage direction, and the second ferroelectric layer 3740 may include a ferroelectric layer imprinted in the (+) voltage direction. As such, as the lamination structure of the first and second ferroelectric layers 3730 and 3740 imprinted in opposite directions to each other is provided between the channel layer 3720 and the gate electrode 3710, each memory cell MC may implement multi-bit functionality having a multi-level of three or more levels. Accordingly there may be improvements in the integration of and/or density of a memory device according to example embodiments.

Figure 21:
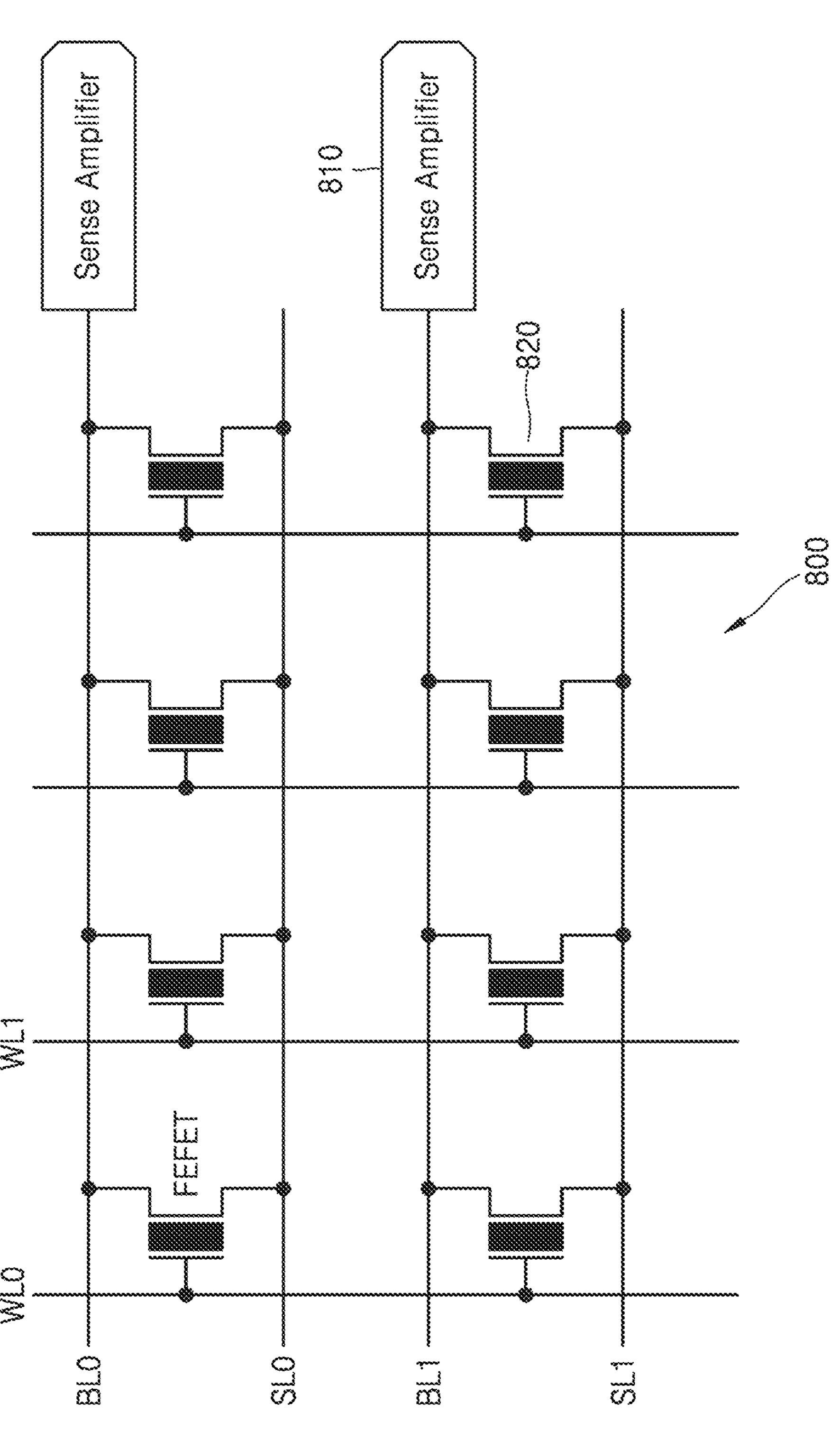
FIG. 21 is a schematic circuit diagram of a memory apparatus according to some example embodiments.

Similar to FIGS. 7 and 8, the first ferroelectric layer 3730 may include a first ferroelectric material layer and first and second interface layers respectively provided on upper and lower surfaces of the first ferroelectric material layer, and the second ferroelectric layer 3740 may include a second ferroelectric material layer and third and fourth interface layers respectively provided on upper and lower surfaces of the second ferroelectric material layer. The lamination structure provided between the channel layer 3720 and the gate electrode 3710 may include a plurality of first ferroelectric layers and a plurality of second ferroelectric layers, and the lamination structure may include a paraelectric layer or an unimprinted third ferroelectric layer. FIG. 21 is a schematic circuit diagram of a memory apparatus 800 according to some example embodiments.

Referring to FIG. 21, the memory apparatus 800 may include an array of a plurality of memory devices 820 arranged in a 2D manner. Each memory device 820 may be a memory cell in the memory apparatus 800. The memory device 820 (FEFET) may be one of the memory devices according to the aforementioned embodiments. In addition, the memory apparatus 800 may include a plurality of bit lines (BL0 and BL1), a plurality of select lines (SL0 and SL1), and a plurality of word lines (WL0 and WL1). The select lines (SL0 and SL1) may be electrically connected to a first source/drain region of the memory device 820, the bit lines (BL0 and BL1) may be electrically connected to a second source/drain region of the memory device 820, and the word lines (WL0 and WL1) may be electrically connected to the gate electrode of the memory device 820. The memory apparatus 800 may further include an amplifier 810 for amplifying a signal output from the bit lines (BL0 and BL1).

Although FIG. 21 shows a 2D plan view for convenience sake, the memory apparatus 800 may have a lamination structure of 2 or more levels. For example, the plurality of bit lines (BL0 and BL1) extending in the vertical direction and the plurality of select lines (SL0 and SL1) may be arranged in a 2D manner, and the plurality of word lines (WL0 and WL1) extending in the horizontal direction may respectively be arranged at a plurality of layers. However, example embodiments are not limited thereto, and the memory cells may be arranged in a 3D manner in various ways.

Figure 22:
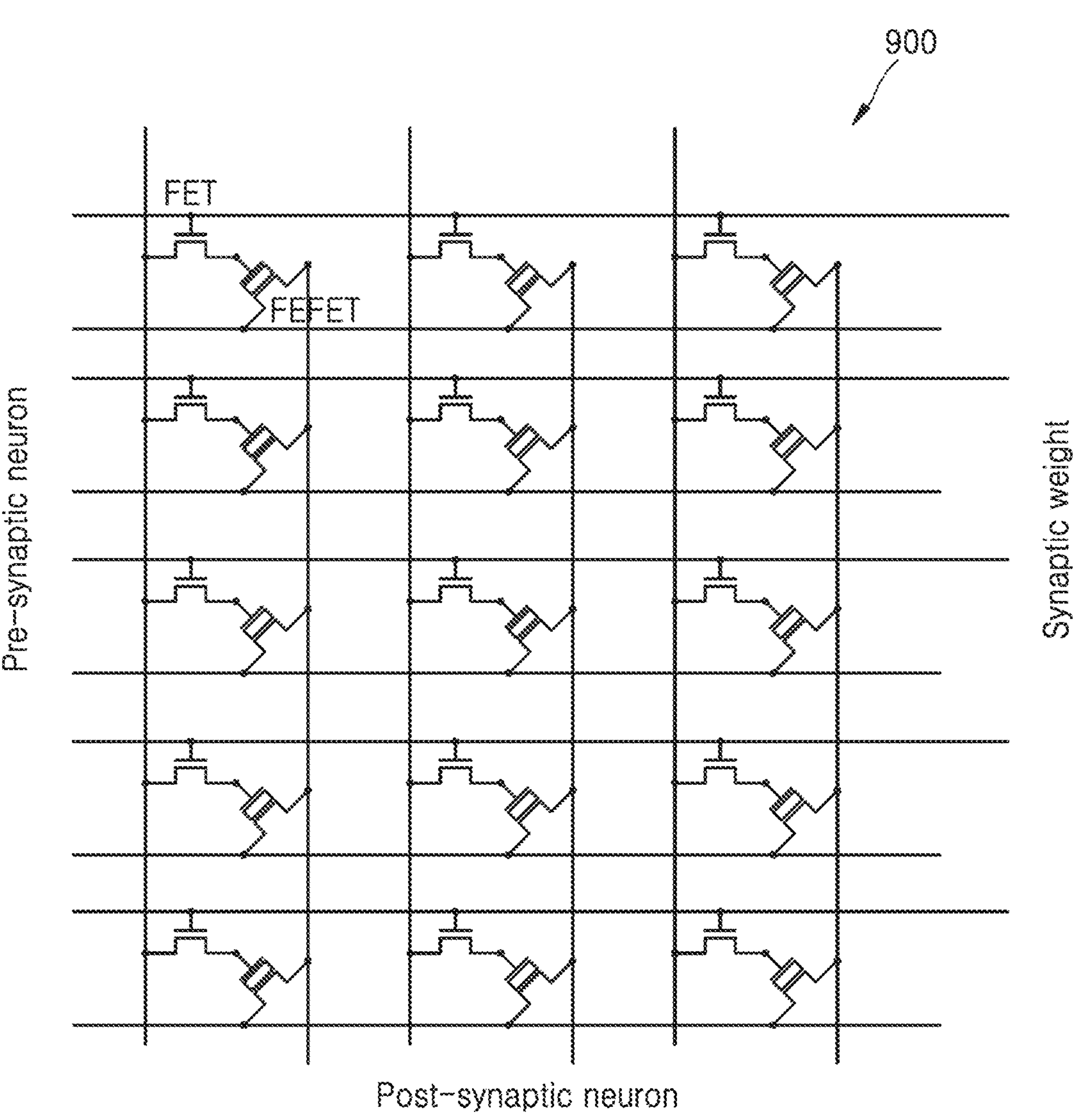
FIG. 22 is a schematic circuit diagram of an artificial intelligence device according to some example embodiments.

The aforementioned memory devices (FEFET) may be applied to an artificial intelligence device 900 illustrated in FIG. 22. Each memory cell constituting the artificial intelligence device 900 may include one FET and one FEFET. The FEFET may be one of the memory devices according to the aforementioned embodiments. When a synaptic weight is applied to a transistor, a potential may be delivered to a ferroelectric material, which may change a state of memory. At this time, when a potential greater than a threshold voltage is applied to the ferroelectric material, a neuron-synapse operation in which a potential of a pre-synaptic neuron is delivered to a post-synaptic neuron may occur.

Figure 23:
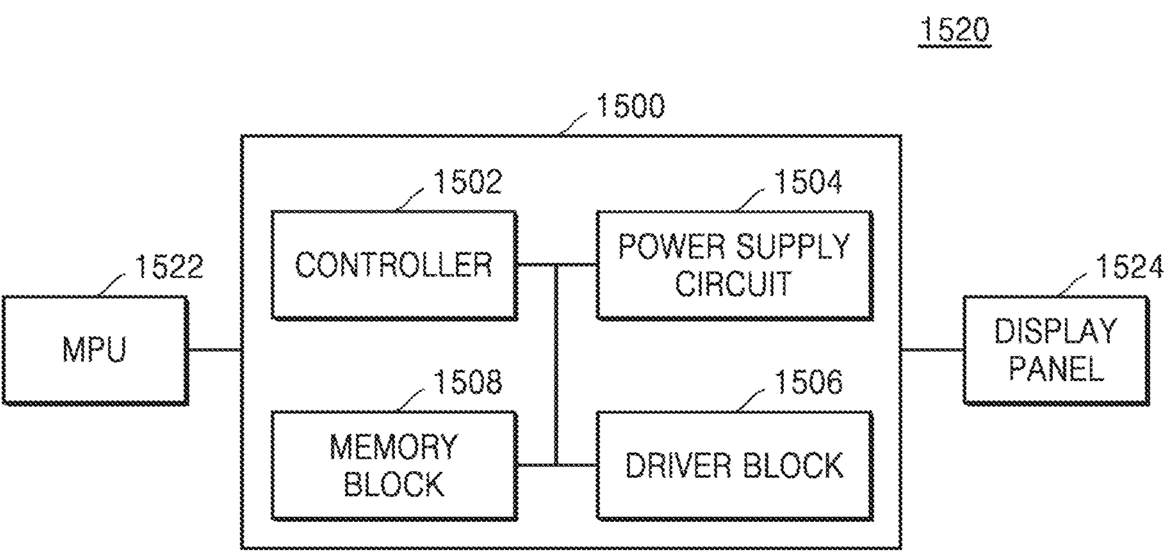
FIG. 23 is a schematic block diagram of a display driver integrated circuit (DDI) and a display apparatus including the DDI according to some example embodiments.

FIG. 23 is a schematic block diagram of a display apparatus 1520 including a display driver integrated circuit (DDI) 1500 according to some example embodiments.

Referring to FIG. 23, the DDI 1500 may include a controller 1520, a power supply circuit 1504, a driver block 1506, and a memory block 1508. The controller 1520 may receive and decode a command applied from a main processing unit (MPU) 1522, and control each block of the DDI 1500 to implement an operation according to the command. The power supply circuit 1504 may generate a driving voltage in response to the control by the controller 1520. The driver block 1506 may drive a display panel 1524 by using the driving voltage generated by the power supply circuit 1504 in response to the control by the controller 1520. The display panel 1524 may be or may include, for example, one or more of a liquid crystal display panel, an organic light-emitting device (OLED) display panel, or a plasma display panel. The memory block 1508 may temporarily store a command input to the controller 1520, control signals output from the controller 1520, or necessary data, and may include a memory such as one or more of RAM, ROM, etc. For example, the memory block 1508 may include the memory devices according to the aforementioned embodiments.

Figure 24:
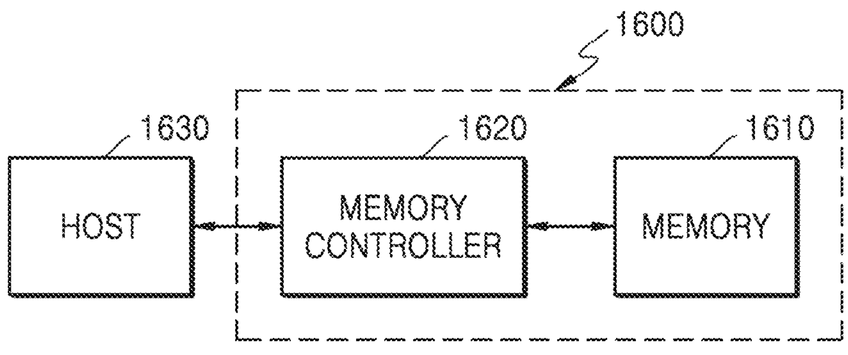
FIG. 24 is a block diagram of an electronic apparatus according to some example embodiments.

FIG. 24 is a block diagram of an electronic apparatus 1600 according to some example embodiments.

Referring to FIG. 24, the electronic apparatus 1600 may include a memory 1610 and a memory controller 1620. The memory controller 1620 may control the memory 1610 to read data from the memory 1610 and/or write data to the memory 1610 in response to a request from a host 1630. The memory 1610 may include the memory devices according to the aforementioned embodiments.

Figure 25:
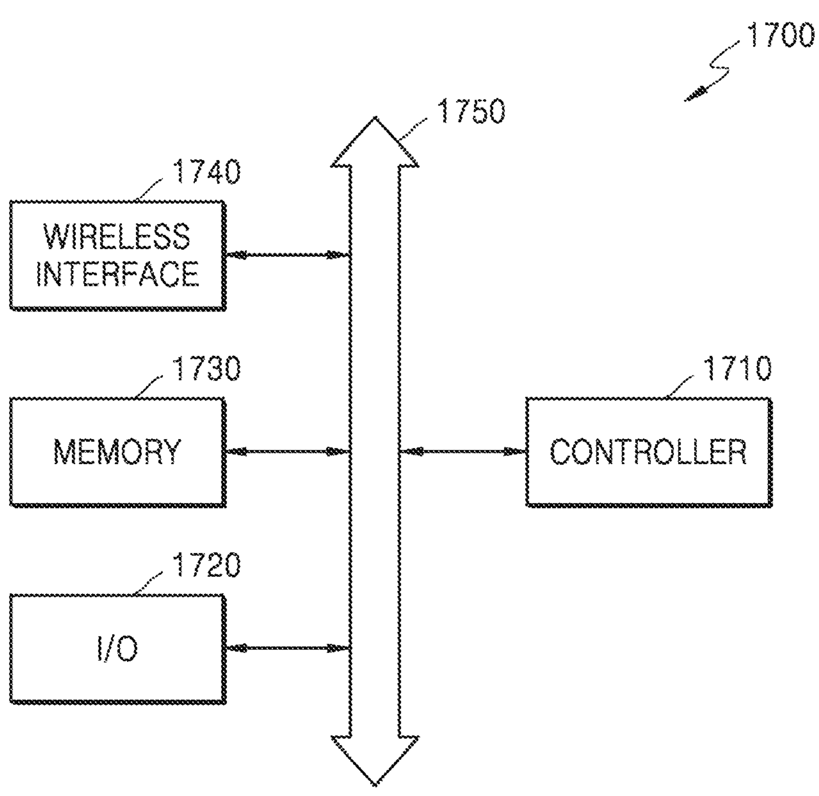
FIG. 25 is a block diagram of an electronic apparatus according to various example embodiments.

FIG. 25 is a block diagram of an electronic apparatus 1700 according to some example embodiments.

Referring to FIG. 25, the electronic apparatus 1700 may constitute a wireless communication apparatus or an apparatus capable of transmitting and/or receiving information in a wireless environment. The electronic apparatus 1700 may include a controller 1710, an input/output (I/O) device 1720, a memory 1730, and a wireless interface 1740, which are connected to each other through a bus 1750.

The controller 1710 may include at least one of a microprocessor, a digital signal processor, and other similar processing apparatuses. The I/O device 1720 may include at least one of a keypad, a keyboard, and a display. The memory 1730 may be used to store a command executed by the controller 1710. For example, the memory 1730 may be used to store user data. The electronic apparatus 1700 may use the wireless interface 1740 to transmit/receive data through a wireless communication network. The wireless interface 1740 may include an antenna and/or a wireless transceiver. In some embodiments, the electronic apparatus 1700 may be used in a communication interface protocol of a third generation communication system, for example, one or more of code division multiple access (CDMA), global system for mobile communications (GSM), North American digital cellular (NADC), and extended-time division multiple access (E-TDMA), and/or a third generation communication system such as wide band code division multiple access (WCDMA). The memory 1730 of the electronic apparatus 1700 may include the memory devices according to the aforementioned embodiments.

Figure 26:
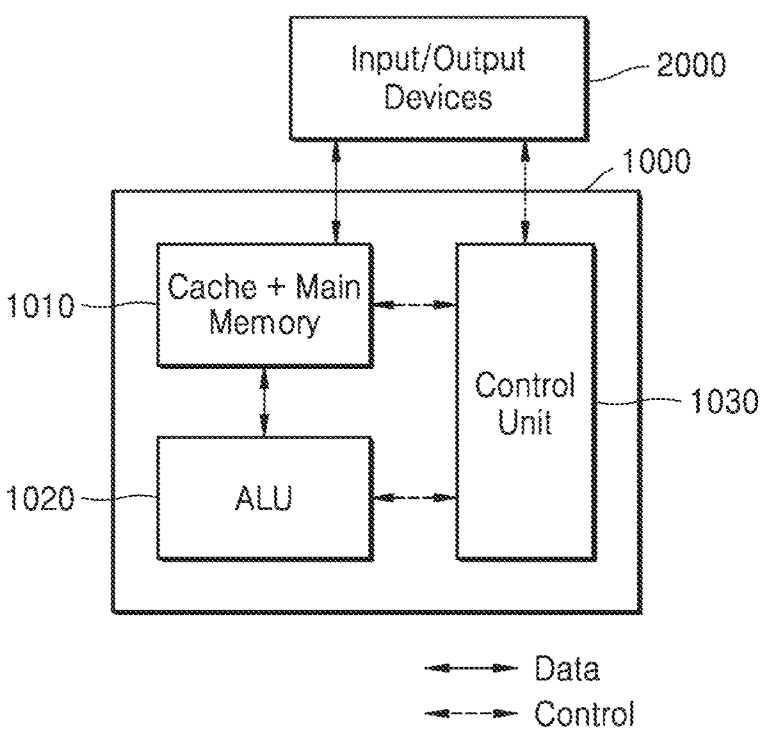
FIGS. 26 and 27 are conceptual diagrams schematically illustrating a device architecture applicable to an electronic apparatus according to some example embodiments.
Figure 27:
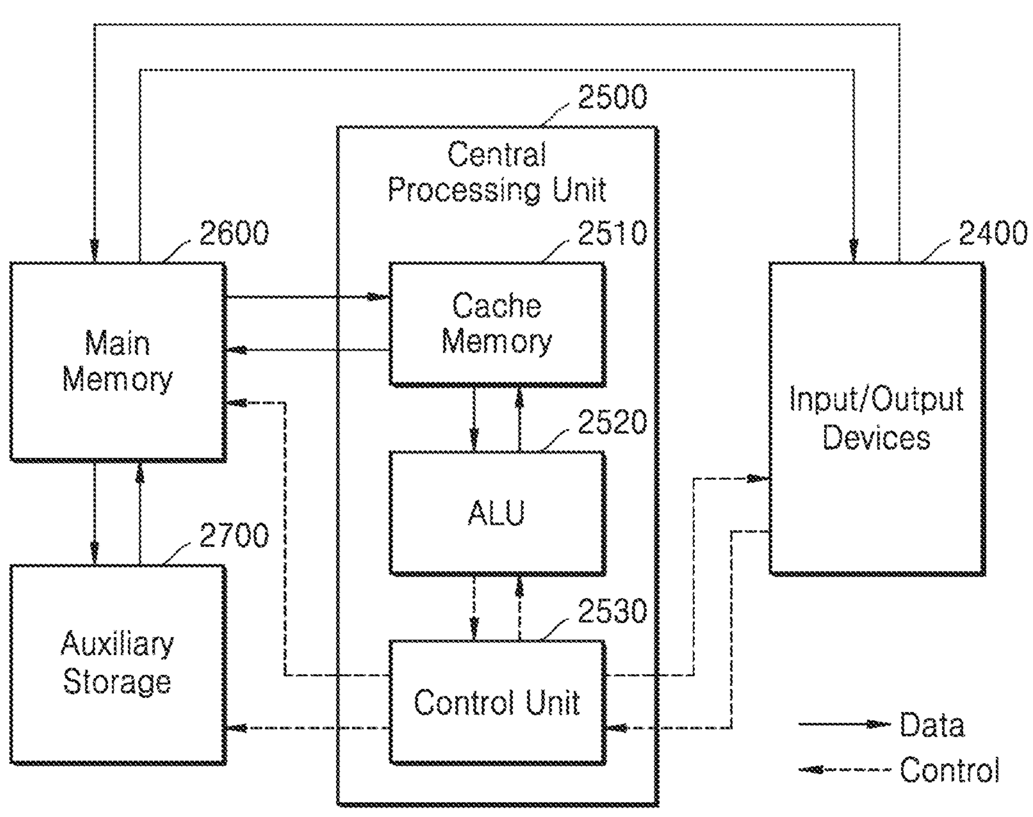

FIGS. 26 and 27 are conceptual diagrams schematically illustrating a device architecture applicable to an electronic apparatus according to some example embodiments.

Referring to FIG. 26, an electronic device architecture 1000 may include a memory unit 1010 and a control unit 1030, and may further include an arithmetic logic unit (ALU) 1020. The memory unit 1010, the ALU 1020, and the control unit 1030 may be electrically connected. For example, the electronic device architecture 1000 may be implemented as a single chip including the memory unit 1010, the ALU 1020, and the control unit 1030. Specifically, the memory unit 1010, the ALU 1020, and the control unit 1030 may be interconnected by a metal line on an on-chip and communicate directly with each other. The memory unit 1010, the ALU 1020, and the control unit 1030 may be integrated on one substrate in a monolithic manner and constitute a single chip. Input/output devices 2000 may be connected to the electronic device architecture (chip) 1000. The memory unit 1010 may include both of a main memory and a cache memory. Such electronic device architecture (chip) 1000 may be an on-chip memory processing unit. The memory unit 1010, the ALU 1020, and/or the control unit 1030 may each independently include the semiconductor device according to the embodiments described above.

Referring to FIG. 27, a cache memory 2510, an ALU 2520, and a control unit 2530 may constitute a central processing unit (CPU) 2500, and the cache memory 2510 may include static random access memory (SRAM). Separate from the CPU 1500, a main memory 2600 and an auxiliary storage 2700 may be provided, and an I/O device 240 may also be provided. The main memory 2600 may include, for example, the semiconductor device according to the embodiments described above.

In some cases, the electronic device architecture may be implemented in a form in which computing unit elements and memory unit elements are adjacent to each other on a single chip without separating sub-units.

According to various example embodiments, the memory device may implement multi-bit having multi-level characteristics of three or more levels by including a lamination structure in which a plurality of ferroelectric layers (or anti-ferroelectric layers) imprinted in opposite directions from each other are laminated in a direction perpendicular to a semiconductor substrate.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that embodiments described herein should be considered in a descriptive sense only and not for purposes of limitation. Descriptions of features or aspects within each example embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A memory device comprising:

a semiconductor substrate;

a gate electrode on the semiconductor substrate; and a plurality of ferroelectric layers including at least one first ferroelectric layer and at least one second ferroelectric layer, the plurality of ferroelectric layers laminated between the semiconductor substrate and the gate electrode in a first direction perpendicular to a surface of the semiconductor substrate, wherein the first ferroelectric layer has a doping concentration gradient in which a doping concentration increases in the first direction, and the second ferroelectric layer has a doping concentration gradient in which a doping concentration decreases in the first direction, and the memory device is configured to implement multi-bit functionality according to an operating voltage.

2. The memory device of claim 1, wherein the first ferroelectric layer and the second ferroelectric layer are imprinted in a (+) voltage direction and a (−) voltage direction, respectively.

3. The memory device of claim 1, wherein the plurality of ferroelectric layers include n ferroelectric layers associated with multi-bit functionality having a multi-level of at least (n+1) levels.

4. The memory device of claim 1, further comprising:

a paraelectric layer between the plurality of ferroelectric layers.

5. The memory device of claim 4, wherein the paraelectric layer includes at least one of $SiO_2$, $Al_2O_3$, $La_2O_3$, and $Y_2O_3$.

6. The memory device of claim 1, further comprising:

a first interface layer and a second interface layer respectively on upper and lower surfaces of the first ferroelectric layer and including different paraelectric materials from each other; and a third interface layer and a fourth interface layer respectively on upper and lower surfaces of the second ferroelectric layer and including different paraelectric materials from each other.

7. The memory device of claim 6, wherein the first interface layer and the fourth interface layer include a same material, and the second interface layer and the third interface layer include a same material.

8. The memory device of claim 1, wherein the first ferroelectric layer and the second ferroelectric layer each include a hafnium oxide incorporating a dopant.

9. The memory device of claim 8, wherein the dopant includes at least one of Zr, La, Al, Si, and Y.

10. The memory device of claim 1, wherein the first ferroelectric layer and the second ferroelectric layer each include an aluminum nitride incorporating a dopant.

11. The memory device of claim 10, wherein the dopant includes at least one of B and Sc.

12. The memory device of claim 1, wherein the plurality of ferroelectric layers further include an unimprinted third ferroelectric layer between the first ferroelectric layer and the second ferroelectric layer.

13. An operating method of a memory device, the memory device comprising:

a semiconductor substrate;

a gate electrode on the semiconductor substrate; and a plurality of ferroelectric layers including at least one first ferroelectric layer and at least one second ferroelectric layer, the plurality of ferroelectric layers laminated between the semiconductor substrate and the gate electrode in a first direction perpendicular to a surface of the semiconductor substrate, wherein the first ferroelectric layer has a doping concentration gradient in which a doping concentration increases in the first direction, and the second ferroelectric layer has a doping concentration gradient in which a doping concentration decreases in the first direction, the operating method comprising obtaining multiple-levels in different polarization states from each other by adjusting an operating voltage based on a hysteresis curve associated with the plurality of ferroelectric layers.

14. The operating method of claim 13, wherein the adjusting of the operating voltage is performed by varying a maximum applied voltage.

15. The operating method of claim 13, wherein the plurality of ferroelectric layers include n ferroelectric layers associated with multi-bit functionality having a multi-level of at least (n+1) levels.

16. A memory apparatus comprising:

a plurality of gate electrodes laminated in a direction perpendicular to a surface of a substrate;

a plurality of ferroelectric layers on the plurality of gate electrodes and including at least one first ferroelectric layer and at least one second ferroelectric layer; and a channel layer on the plurality of ferroelectric layers, wherein the first ferroelectric layer has a doping concentration gradient in which a doping concentration increases in a first direction, and the second ferroelectric layer has a doping concentration gradient in which a doping concentration decreases in the first direction, and the memory apparatus is configured to implement multi-bit functionality according to an operating voltage.

17. The memory apparatus of claim 16, wherein the plurality of gate electrodes define a through hole in the direction perpendicular to the surface of the substrate, and the plurality of ferroelectric layers and the channel layer are sequentially on an inner wall of the through hole in a direction parallel with the substrate.

18. The memory apparatus of claim 16, wherein each of the first ferroelectric layer and the second ferroelectric layer extends in the direction perpendicular to the surface of the substrate, and the first direction is parallel with the substrate.

19. The memory apparatus of claim 16, further comprising:

a paraelectric layer between the plurality of ferroelectric layers.

20. The memory apparatus of claim 16, further comprising:

a first interface layer and a second interface layer respectively on one surface and another surface of the first ferroelectric layer and including different paraelectric materials from each other; and a third interface layer and a fourth interface layer respectively on one surface and another surface of the second ferroelectric layer and including different paraelectric materials from each other.

* * * * *